United States Patent
Walker et al.

(10) Patent No.: US 6,278,709 B1
(45) Date of Patent: Aug. 21, 2001

(54) ROUTING SWITCH

(75) Inventors: Christopher Paul Hulme Walker, Furzton; Barry Michael Cook, Market Drayton, both of (GB)

(73) Assignee: 4 Links for Technical Help, Milton Keynes (GB)

(*) Notice: Subject to any disclaimer, the term of this patent is extended or adjusted under 35 U.S.C. 154(b) by 0 days.

(21) Appl. No.: 08/915,952

(22) Filed: Aug. 21, 1997

(30) Foreign Application Priority Data

Aug. 21, 1996 (GB) .................................................. 9617553

(51) Int. Cl.$^7$ .................................................. H04L 12/28
(52) U.S. Cl. ........................................... 370/392; 370/393
(58) Field of Search .................................... 370/392, 395, 370/389, 401, 382, 402, 422, 388, 370, 393, 380, 403, 394

(56) References Cited

U.S. PATENT DOCUMENTS

| | | | | |
|---|---|---|---|---|
| 4,387,441 | * | 6/1983 | May et al. | 370/60 |
| 4,577,313 | * | 3/1986 | Sy | 370/403 |
| 4,935,926 | * | 6/1990 | Herman | 370/401 |
| 5,130,977 | * | 7/1992 | May et al. | 370/422 |
| 5,422,881 | * | 6/1995 | May et al. | 370/392 |
| 5,703,875 | * | 12/1997 | Burnett | 370/381 |
| 5,734,651 | * | 3/1998 | Blakeley et al. | 370/392 |

FOREIGN PATENT DOCUMENTS

| | | |
|---|---|---|
| 0 441 257 A2 | 8/1991 | (EP) . |
| 0 446 493 A1 | 9/1991 | (EP) . |
| 0629067 | 12/1994 | (EP) . |
| 2 168 222 | 6/1986 | (GB) . |
| 2 290 004 | 12/1995 | (GB) . |
| WO 88/07298 | 9/1988 | (WO) . |

* cited by examiner

*Primary Examiner*—Chau Nguyen
*Assistant Examiner*—Alexander O. Boakye
(74) *Attorney, Agent, or Firm*—Darby & Darby

(57) ABSTRACT

In a routing switch a technique for routing messages from an input port to an output port involves storing a plurality of sets of routing information in the routing switch, each set associated with a value of a header of the message. The technique involves grouping outputs which are suitable for outputting the same message. In the routing network, unicast packets include multiple headers and multicast packets include single headers. Sequence numbers of packets in the message are encoded in the packets by use of a longitudinal checksum. In the routing switch, messages are prioritized for routing in dependence on a priority allocated to the respective header.

23 Claims, 14 Drawing Sheets a)

| BIT 7 | BIT 6 | BIT 5 | BIT 4 | BIT 3 | BIT 2 | BIT 1 | BIT 0 | |
|---|---|---|---|---|---|---|---|---|
| 0 | 0 | 1 | 0 | 0 | 0 | 1 | 0 | SEQUENCE NUMBER OF PACKET / CELL IS 2, PRESENTED ON BITS 7:4 AND BITS 3:0 |
| 0 | 1 | 0 | 1 | 0 | 1 | 0 | 1 | HEADER BYTE IS 55 |
| 0 | 0 | 0 | 1 | 1 | 1 | 1 | 1 | CHANNEL ID BYTE IS 1F |
| 1 | 0 | 1 | 1 | 1 | 1 | 0 | 0 | FIRST DATA BYTE IS BC |
| 0 | 0 | 0 | 0 | 0 | 0 | 0 | 1 | SECOND AND LAST DATA BYTE IS 01 |
| 1 | 1 | 0 | 1 | 0 | 1 | 0 | 1 | CHECKSUM TO GIVE EVEN NUMBER OF ONES IN EACH BIT-COLUMN | b)

| BIT 7 | BIT 6 | BIT 5 | BIT 4 | BIT 3 | BIT 2 | BIT 1 | BIT 0 | |
|---|---|---|---|---|---|---|---|---|
| 0 | 1 | 0 | 1 | 0 | 1 | 0 | 1 | HEADER BYTE IS 55 |
| 0 | 0 | 0 | 1 | 1 | 1 | 1 | 1 | CHANNEL ID BYTE IS 1F |
| 1 | 0 | 1 | 1 | 1 | 1 | 0 | 0 | FIRST DATA BYTE IS BC |
| 0 | 0 | 0 | 0 | 0 | 0 | 0 | 1 | SECOND AND LAST DATA BYTE IS 01 |
| 1 | 1 | 0 | 1 | 0 | 1 | 0 | 1 | CHECKSUM | c)

| BIT 7 | BIT 6 | BIT 5 | BIT 4 | BIT 3 | BIT 2 | BIT 1 | BIT 0 | |
|---|---|---|---|---|---|---|---|---|
| 0 | 1 | 0 | 1 | 0 | 1 | 0 | 1 | HEADER BYTE IS 55 |
| 1 | 1 | 0 | 1 | 0 | 1 | 0 | 1 | ORIGINAL CHECKSUM |
| 1 | 0 | 0 | 0 | 0 | 0 | 0 | 0 | REVISED CHECKSUM IS EXCLUSIVE OR OF ORIGINAL CHECKSUM AND STRIPPED HEADER |

FIG. 10 d)

| BIT 7 | BIT 6 | BIT 5 | BIT 4 | BIT 3 | BIT 2 | BIT 1 | BIT 0 | |
|---|---|---|---|---|---|---|---|---|
| 0 | 0 | 0 | 1 | 1 | 1 | 1 | 1 | CHANNEL ID BYTE IS 1F |
| 1 | 0 | 1 | 1 | 1 | 1 | 0 | 0 | FIRST DATA BYTE IS BC |
| 0 | 0 | 0 | 0 | 0 | 0 | 0 | 1 | SECOND AND LAST DATA BYTE IS 01 |
| 1 | 0 | 0 | 0 | 0 | 0 | 0 | 0 | REVISED CHECKSUM | e)

| BIT 7 | BIT 6 | BIT 5 | BIT 4 | BIT 3 | BIT 2 | BIT 1 | BIT 0 | |
|---|---|---|---|---|---|---|---|---|
| 0 | 0 | 0 | 1 | 1 | 1 | 1 | 1 | CHANNEL ID BYTE IS 1F |
| 1 | 0 | 1 | 1 | 1 | 1 | 0 | 0 | FIRST DATA BYTE IS BC |
| 0 | 0 | 0 | 0 | 0 | 0 | 0 | 1 | SECOND AND LAST DATA BYTE IS 01 |
| 1 | 0 | 0 | 0 | 0 | 0 | 0 | 0 | REVISED CHECKSUM |
| 0 | 0 | 1 | 0 | 0 | 0 | 1 | 0 | EXCLUSIVE OR OF EACH COLUMN GIVES THE CHECK SYNDROME WHICH IS THE ORIGINAL SEQUENCE NUMBER IN BITS 7:4 AND BITS 3:0 |

FIG. 10 CONT'D

ROUTING SWITCH

FIELD OF THE INVENTION

The present invention relates to a routing switch for use in a network for transmitting serial message packets between a source node and a destination node. The invention relates particularly, but not exclusively, to such a network where message packets are transmitted from a single source node to a single destination node, and where packets are also transmitted from a single source node to multiple destination nodes.

BACKGROUND OF THE INVENTION

For high speed networks, particularly in the home, there is a need for a communication system which is efficient, which minimises the bandwidth required in the cables (and the corresponding radiation from the cables), and which minimises the cost and complexity of any repeaters, bridges, or routing switches in the network, and which places no constraint on the topology required of a network in order that the network functions.

A number of bridging, routing and switching technologies exist which have some, but not all, of the desirable properties required for a high speed network.

IEEE 1394 does not have a routing network, but is logically a bus with every node seeing every bit. Many of the packets are asynchronous packets which go from one source to one destination, and this is very wasteful of cable bandwidth. IEEE 1394 has bridges to isolate logical buses, but the bridges are not simple devices and are likely to be expensive.

ATM uses switches and makes efficient use of bandwidth. However, ATM is designed for a global network, and consequently has complications therein far beyond what is necessary for a high speed network in the home.

The STC104, used for IEEE 1355, is much simpler than ATM and this makes it possible to build the STC 104 with 32 full-duplex serial ports. The chip is, however, one of the largest chips made, and has around 28 k bits of memory—memory all made up of special registers. The STC 104 only provides for unicast packets, i.e. where message packets are transmitted from a single source to a single destination. Multicast packets where transmissions from a single source to multiple destinations or broadcast where transmission is from a single source to all destinations is desirable for a home network.

The ICR C416 is a simple routing switch, with physical routing which requires no initialisation. The ICR C416 uses one byte of header for each routing switch between source and destination, stripping the header at each switch. Like the STC 104, output ports can be grouped, so that several ports become logically a single port with higher bandwidth. Again, however, like the STC 104 it supports only unicast, (and not multicasting or broadcasting of packets).

Thus, it would be desirable to provide a routing switch suitable for a high speed network, particularly in the home, which was capable of routing packets or cells from a source to a single destination (i.e. unicast), to multiple destinations (i.e. multicast) and to all destinations (i.e. broadcast). In addition, for use in a home network, any routing switch must be compatible with any topology the untrained user arbitrarily constructs.

The routing switch must be capable, for use in a home network, of minimising bandwidth, power consumption, and RFI emissions, so that traffic should only travel on links necessary for the connection. In addition, it is essential that costs must be minimised, within the constraint of providing the necessary functionality and efficiency.

SUMMARY OF THE INVENTION

Thus, it is an object of the present invention to provide a routing switch which enables headers associated with message packets to be used efficiently to determine which input port is to be connected to which output port for a given input packet message or cell.

Thus according to an aspect of the present invention there is provided a method of routing a message packet including a header from an input to an output of a routing switch, the method comprising the steps of storing a plurality of sets of routing information, each set being associated with one value of the header, accessing a stored set of routing information in dependence on the header of the message packet to be routed and routing the message packet to one of a plurality of outputs of the routing switch in dependence on the accessed set of routing information.

This aspect of the invention also provides a routing switch having a plurality of inputs for receiving message packets each including a header comprising storage circuitry for storing a plurality of sets of routing information, each set being associated with one value of the header, address circuitry responsive to the header of the message packet to be routed and for accessing the stored set of routing information associated therewith and connection circuitry for routing the message packet to the at least one of the plurality of outputs in dependence on the accessed set of routing information.

Once the decision on which output port the input message or packet is to be directed to is made, the ports are connected by a connection mechanism such as a cross bar switch.

The present invention allows the use of only a small amount of memory for each output port, and uses that memory to determine whether that port is associated with the incoming routing information given by a single byte, in the preferable embodiment, of routing header. The memory is initialised for physical routing of unicast packet/cells only, so that a network mapping program, running from one (or more) nodes of the network can determine the network and set up the sets of routing information in the routing tables accordingly.

In a routing network, there are sometimes provided multiple parallel collections between different routing switches, and also it may well be that it is possible to transmit a message packet from one routing switch to another routing switch via more than one output path. It may well be that multiple routing paths are provided between two routing switches because there is sufficient traffic between the routing switches to warrant multiple connections. A technique used both in the STC 104 and the ICR C416 is known as grouped adaptive routing, whereby if there are several connections between two switches, a packet/cell addressed to one of them can use any other group of links which is available, rather than having to wait for the addressed link to become available.

On the STC 104 and ICR C416, grouped routing is used for unicast. However, grouped routing would be even more useful in the home network if used for multicast. This is because a multicast packet/cell has to wait until all the addressed output ports to which it is to be output from are available, and there is a much better chance of one of a group being available than of a particular link being available.

It is thus another object of the present invention to provide a routing switch in which grouping can be used with both unicast and multicast packet/cells.

According to an aspect of the present invention there is provided a method of routing a message packet from an input to an output of a routing switch, the message packet including a header indicative of the output of the routing switch to which the message packet is to be routed, wherein the routing switch has a plurality of outputs suitable for transmitting the message packet, the method comprising the step of routing the message packet to any one of the plurality of outputs if the header indicates the message packet is to be routed to a particular one of the plurality of outputs.

This aspect of the invention also provides a routing switch having a plurality of inputs for receiving message packets each message packet including a header indicative of at least one of a plurality of outputs of the routing switch to which the message packet is to be routed, the routing switch comprising storage circuitry for storing a plurality of sets of grouping information, each set being associated with one output of the routing switch, wherein for each output the set of grouping information groups other outputs of the routing switch additionally suitable for transmitting any message packet which may be transmitted on that output, addressing circuitry, responsive to the header of the message packet to be transmitted, for outputting the identity of each output in the group associated with the indicated output and selection circuitry for selecting one of the outputs in the group for outputting the message packet.

It is another object of the invention to provide a routing switch which enables headers associated with message packets to be used efficiently to determine which input port is to be connected to which output port for a given input packet message or cell and to provide a routing switch in which grouping can be used with both unicast and multicast packets/cells.

Thus according to an aspect of the present invention there is provided a method of routing a message packet from an input to at least one of a plurality of outputs of a routing switch, the message packet including a header indicative of the at least one of the plurality of outputs of the routing switch to which the message packet is to be routed, the method comprising the steps of storing a plurality of sets of routing information, each set being associated with one value of the header, accessing a stored set of routing information in dependence on the header of the message packet to be routed and routing the message packet in dependence on the accessed set of routing information, wherein the routing switch has a plurality of outputs suitable for outputting the message packet, the method further comprising the step of routing the message packet to any one of a group of suitable outputs if the accessed set of routing information indicates that the message packet is to be routed to a particular one of the plurality of outputs.

This aspect of the invention also provides a routing switch having a plurality of inputs for receiving message packets each message packet including a header indicative of at least one of a plurality of outputs of the routing switch to which the message packet is to be routed, the routing switch comprising first storage circuitry for storing a plurality of sets of routing information, each set being associated with one value of the header, first addressing circuitry responsive to the header of the message packet to be routed and for accessing the stored set of routing information associated therewith, connection circuitry for routing the message packet to the at least one of the plurality of outputs in dependence on the accessed set of routing information, second storage circuitry for storing a plurality of sets of grouping information, each set being associated with one output of the routing switch, wherein for each output the set of grouping information groups other outputs of the routing switch additionally suitable for transmitting any message packet which may be transmitted on that output, second addressing circuitry, responsive to the stored set of routing information, for accessing the identity of each output in the group associated with the one output and selection circuitry for selecting one of the outputs in the group for outputting the message packet.

One known message packet format for transmitting message packets through a network is to provide the message packet with multiple headers which essentially predefine the route of the message packets through the network, each of the multiple headers being associated with one routing switch in the network, and successive headers being deleted from the message packet as the message packet traverses through the successive routing switches. Such header stripping at each node is done, for example, by the ICR C416 routing switch.

If a packet/cell is intended for multicast transmission, then different destinations of the multicast message packet will receive the packet/cell with different sizes of header. It would be desirable to transmit multicast messages using a single header throughout the network, rather than multiple headers. However, for unicast message packets it is still desirable to retain the multiple header format Thus it is an object of another aspect of the present invention to provide a packet cell format for use in a routing switch in which multiple headers are included in the message packet for unicast transmissions, and single headers are used for multicast transmissions.

Thus according to an aspect of the present invention there is provided a method of allocating headers to message packets serially output from a source node, the message packets being routed through a succession of routing switches to a destination node, the method comprising the steps of allocating a plurality of headers to the message packet if the message packet is to be routed to one destination node, the plurality of headers each being associated with a respective one of the successive switches in the route for routing the message packet and allocating a single header to the message packet if the message packet is to be routed to a plurality of destination nodes, the single header being associated with each routing switch in the route to route the message packet.

Those message packets having multiple headers have the front header thereof stripped at each switch, whereas those having a single header retain their header at each switch.

European Patent Application No. 94304141.8 describes a method of checking for multiple bit transmission errors by using a longitudinal parity checksum. This method is particularly appropriate to a system where routing headers are added or deleted, because a correct checksum can be generated simply by exclusive OR-gating the current checksum with a header byte or bytes that have been changed (either added or deleted).

Each packet of a message is transmitted in a particular order or sequence, and should be received in the same order or sequence. Thus, it would be useful to check the sequence of message packets/cells received to check for cases when the message packets/cells are received out of order by allocating to each message packet a sequence number identifying the sequence or order of that packet in a message.

Thus it is an object of another aspect of the present invention to provide a simple technique for encoding the sequence number of a packet in a message into the message packet.

Thus according to an aspect of the present invention there is provided a method of encoding in a message packet the sequence number of the packet in the message, the message packet comprising a plurality of sets of information bits constituting an information portion and a set of checking bits, all sets containing the same number of bits and each checking bit having been generated by taking the logical sum of bits in all of the sets having the same significance, the method comprising the steps of determining the sequence number of the packet, converting the sequence number into a set of sequence bits having the same number of bits as the sets of information bits and the set of checking bits, and modifying the checking bits by taking the logical sum of the set of checking bits and the set of sequence bits.

This aspect of the invention also provides circuitry for encoding the sequence number of a message packet in a message in the message packet, the message packet comprising a plurality of sets of bits constituting an information portion of the packet and a set of checking bits, each checking bit having been generated by taking the logical sum of bits in all the sets having the same significance, said circuitry comprising an input circuit for receiving the message packet, a counter for determining the sequence number of the packet, a converter for converting the sequence number into a set of bits having the same number of bits as the sets of information bits and the checking bits and means for modifying the checking bits by taking the logical sum of the set of checking bits and the set of sequence bits.

In a routing switch having multiple inputs, it is common for more than one of the inputs to receive a message packet for routing at the same time. In such circumstances it is necessary for the routing switch to arbitrate between the received message packets to determine which message packets would be routed first. The arbitration provided between received input message packets has previously been arbitrary, with priority levels merely allocated to each of the input ports. However, it would be desirable to have the arbitration based on the priority of the incoming header value of the received message packet in certain circumstances.

Thus it is an object of another aspect of the present invention to provide a technique for prioritising incoming message packets to determine which message packet to route first.

Thus according to an aspect of the present invention there is provided a method of routing message packets in a routing switch comprising receiving a plurality of message packets at respective ones of a plurality of inputs of a routing switch, each message packet including a header indicative of, the at least one of a plurality of outputs of the routing switch it is to be routed to, allocating, to each one of a plurality of values of the header, a priority level, determining the priority level of the header of each message packet received at the plurality of inputs and routing the message packet including the header having the highest priority of all message packets received.

This aspect of the invention also provides a routing switch having a plurality of inputs and a plurality of outputs comprising input circuitry for receiving message packets on the plurality of inputs, each message packet including a header having a priority level associated therewith, header arbitration circuitry for receiving the header of each received message packet and for generating a priority signal indicative of the message packet having the highest priority header, connection circuitry, responsive to the priority signal, for routing the received message packet including the header having the highest priority and output circuitry for outputting the message packet to be routed to at least one of the plurality of outputs.

For a better understanding of the present invention and to show how the same may be carried into effect, reference will now be made by way of example to the accompanying drawings, in which:

BRIEF DESCRIPTION OF THE DRAWINGS

FIG. 10 illustrates a sequence of operations for generating and checking a checksum including the sequence of the respective packet in the message packet;

DESCRIPTION OF THE PREFERRED EMBODIMENT

Figure 1:
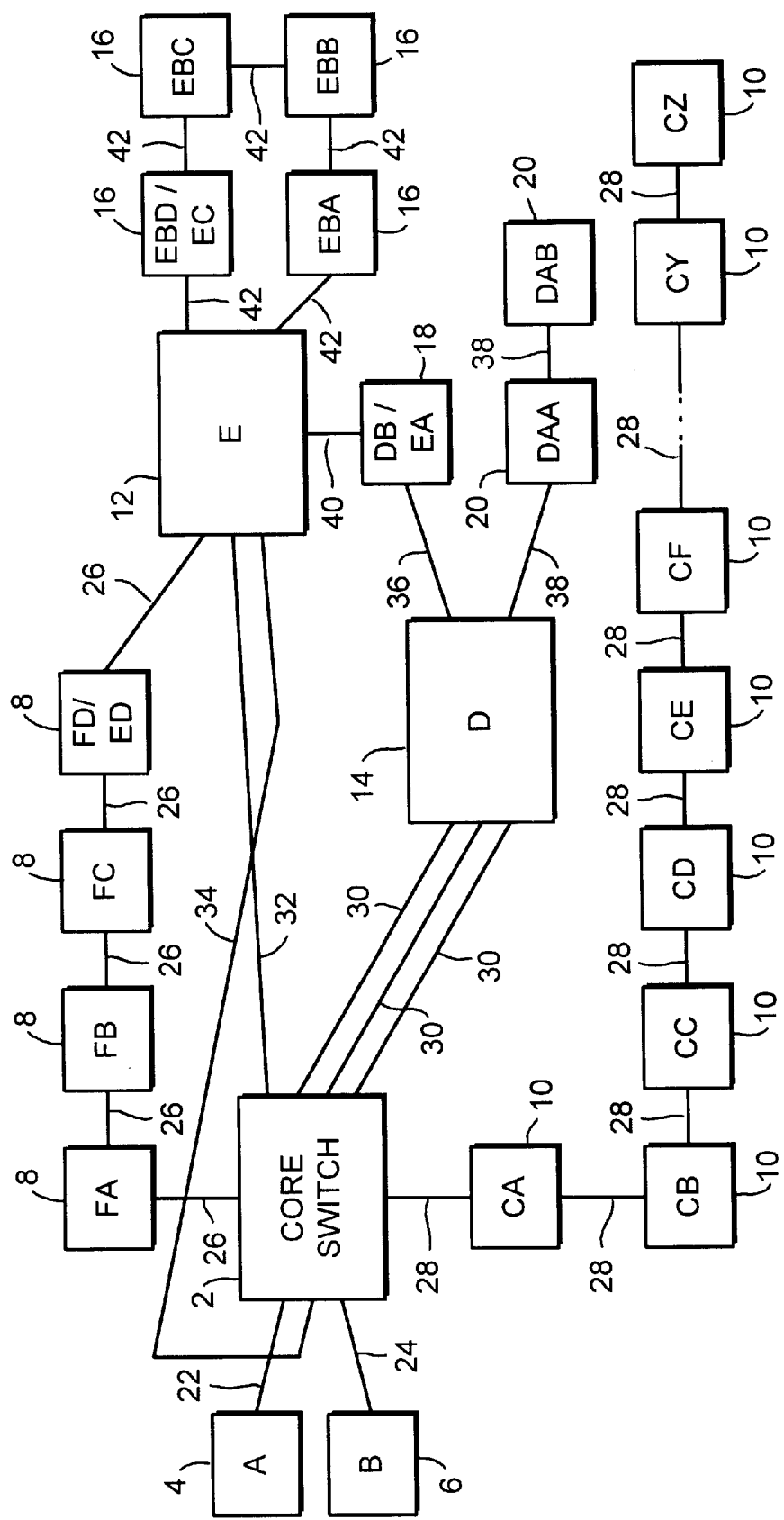
FIG. 1 is a block diagram of a routing network.

FIG. 1 illustrates a number of nodes connected in a routing network. The routing network shown in FIG. 1 is a typical example of the type of network which may be found in a home network. Referring to FIG. 1 it can be seen that there is a core switch 2 and two other main interface switches D 14 and E 12. A node A 4 has a single connection via link 22 to the core switch 2, and a switch B 6 has a single connection via link 24 to the core switch 2. The core switch 2 is connected via links 28 to nodes CA to CZ 10 via various serial "daisy-chain" links 28. The core switch 2 is connected via links 26 to the switch E12 via daisy-chained blocks FA to FD 8. The switch D is connected to the switch E via links 36 and 40 via switch DB/EA 18. The switch D 14 is connected via link 38 to the switches DAA 20 and DAB 20. A loop connection from switch E via links 42 is provided via switches EBA to EBD 16.

Thus FIG. 1 shows various types of interconnection. Much of the variety and irregularity of the connections in FIG. 1 arises from the fact that users of the home network are inevitably untrained in any aspect of network topologies, and therefore do not necessarily arrange the network in an efficient or economic manner. The network must therefore be designed in such a way that it will work whatever its topology, which precludes any network which requires loops, or which requires a tree without loops. FIG. 1 shows various types of interconnection:

- nodes connected directly to a routing switch, for example nodes A and B connected directly to core switch 2;
- nodes connected along daisy-chains without a loop for example nodes CA to CZ;
- a hierachy of routing switches for example switches D and E both connected to the core switch 2;
- adjacent multiple connections between routing switches for example the three connections 30 between the core switch 2 and the switch D14;
- non-adjacent multiple connections between routing switches for example connection between core switch 2 and switch E12 via links 32 and 34;
- nodes connected in a daisy-chain, with connections to different switches at each end, for example switches FA to FD; and
- nodes connected in a daisy-chain with connections to the same switch at each end, for example nodes EBA to EBD.

Each of the nodes shown in FIG. 1 having more than one port contain a routing switch. Nodes A, B, DAB and CZ are all single port nodes and so do not contain switches. Each node may also have some functionality associated therewith, or be connected via other links directly to a functional or peripheral device.

Figure 2:
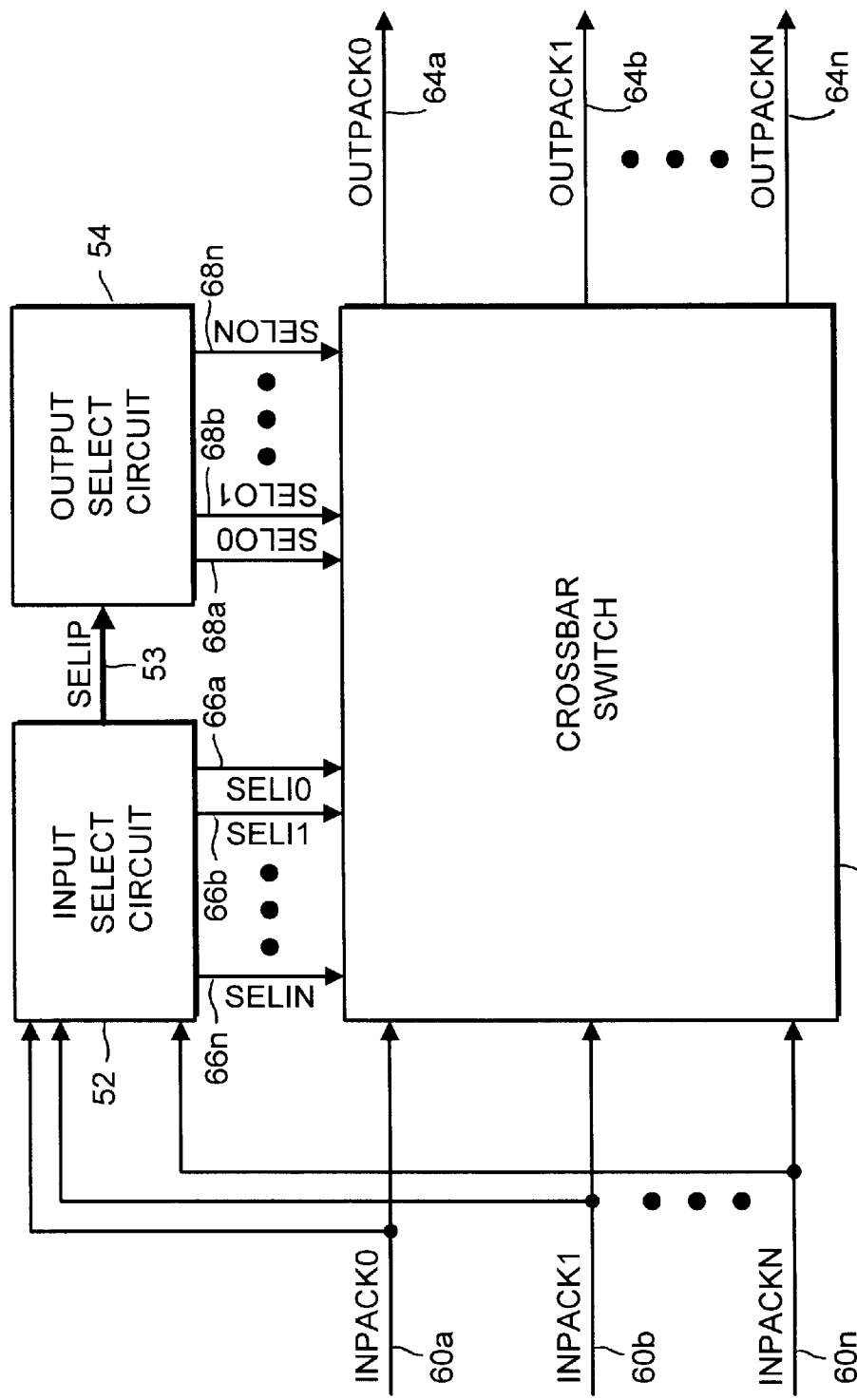
FIG. 2 is a block diagram of a routing switch.

Referring to FIG. 2 there is illustrated a schematic block diagram of a routing switch showing the important elements thereof. The routing switch shown in FIG. 2 includes a crossbar switch 50, an input select circuit 52, and an output select circuit 54. The routing switch receives a plurality of input signals INPACK0 to INPACKn on signal lines 60a to 60c. These input signals form respective inputs to the crossbar switch 50. The input signals to the routing switches such as that shown in FIG. 2 will be serial signals, typically message packets including headers, address and data information, parity checking information etc as will be described hereinafter with reference to FIG. 3 and 4.

The routing switch outputs a plurality of output signals OUTPACK0 to OUTPACKn on signal lines 64a to 64n. The input signals INPACK0 to INPACKn on lines 60a to 60c also form inputs to the input select circuit 52. The input select circuit generates output signals SELI0 to SELIn on lines 66a to 66n which form inputs to the crossbar switch. The input select circuit outputs a signal SELIP, described in detail further hereinafter, on bus 53 to the output select circuit 54. The output select circuit 54 outputs a plurality of signals SELO0 to SELOn on lines 68a to 68n which form inputs to the crossbar switch 50.

The routing switch may be provided with a plurality of input buffers associated with respective ones of the input signals INPACK0 to INPACKn, and a plurality of output buffers associated with respective ones of the output signals OUTPACK0 to OUTPACKn. However these are not shown in the Figures for reasons of clarity.

Figure 3:
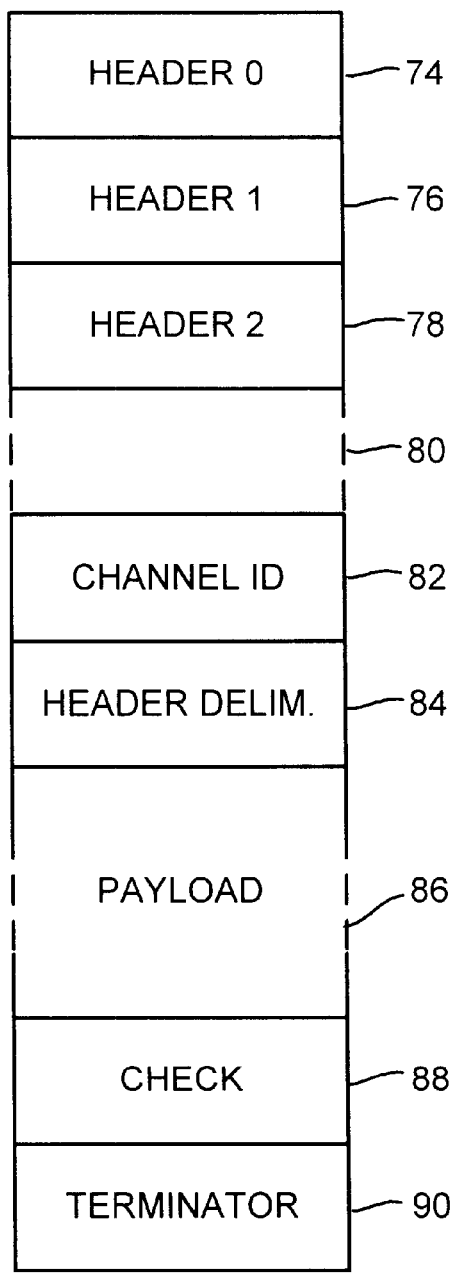
FIG. 3 is an example of the format of one type of message packet.
Figure 4:
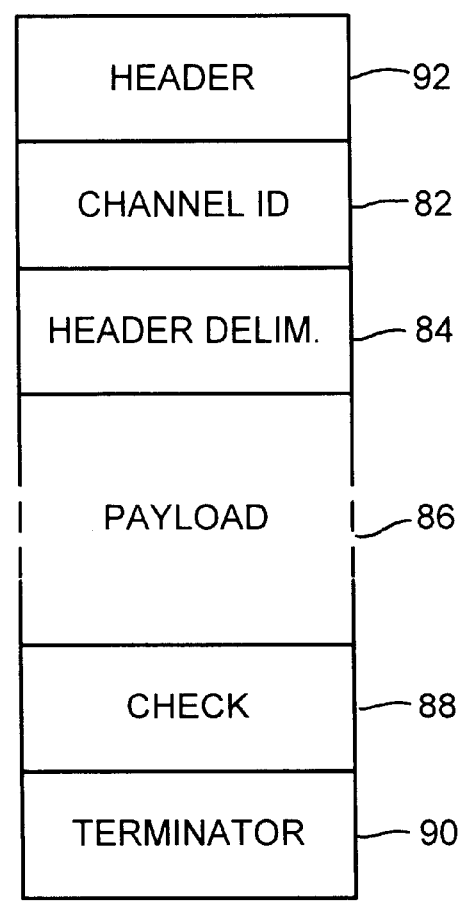
FIG. 4 is an example of the format of another type of message packet.

The purpose of the routing switch is to connect an input message INPACK0 to INPACKn on one of the lines 60a to 60c to one of the lines 64a to 64n to form one of the output message packets OUTPACK0 to OUTPACKn. Referring to FIGS. 3 and 4, some further explanation of the format of the message packets routed by the routing switch will now be described. For the purpose of description, an embodiment is described in which each header of a message packet is a byte. However, it will be apparent that any other lengths of header may incorporate the present invention.

In one embodiment, each message packet comprises a plurality of header bytes, Header 0 74, Header 1 76 and Header 2 78 and possibly additional headers 80, a channel identifier 82, a header delimiter 84, a payload 86, a checking field 88, and a terminator 90. When such a message packet format is used, the number of header bytes in the message packet will correspond to the number of routing switches through which the message must transverse on its route from its source to its destination node. Thus, Header 0 74 would be used by the first routing switch in the route, Header 1 by the second routing switch in the route etc. In one embodiment, the header byte used by successive routing switches is stripped prior to transmission of the message packet to the next routing switch in the network.

The channel identifier ensures that whether a packet is unicast or multicast, the first byte received at the destination is always some form of channel identifier, rather than being pure data.

The header delimiter 84 is an optional inclusion in the message packet, and provides additional security that a header can never be interpreted as data or vice versa. The checking field 88 provides an optional parity check on a message packet, and as described in detail hereinafter may be preferably formed using a longitudinal parity checksum. The terminator field 90 merely identifies the end of a packet and is used by control means within the routing switch or the network.

FIG. 4 shows an alternative structure of a message packet transmitted through the network. In this embodiment, the message packet has a single header byte 92, a channel identifier field 82, a header delimiter 84, a payload 86, a checking field 88, and a terminator 90. When using such a message packet, the single header byte 92 is used by every routing switch in the network to route the message packet, and is never stripped from the message.

In a network utilising the present invention in which both message packets of the type shown in FIG. 3 and the type shown in FIG. 4 may be transmitted, it is necessary for the routing switch to know which type of message format is being routed to determine whether header bytes are deleted or not. A technique for determining such in accordance with the present invention is described in detail hereinafter.

Referring back to FIG. 2, the header fields of input message packets received on any of the inputs of the routing switch are input to the input select circuit 52. The input select circuit 52 is used for selecting between a plurality of message packets received on the inputs of the routing switch, and determining which is to be routed first by setting the appropriate one of its outputs SELI0 to SELIn on lines 66a to 66n.

The crossbar switch 50 is a standard crossbar switch, many types of which are commercially available. A standard crossbar switch is used in components such as the STC104 and ICR C416. In response to one of the signals SELI0 to SELIn on lines 66a to 66n being set the crossbar switch prepares to route the appropriate one of its multiple inputs. The header at the front of the message packet of the selected input message packet is output on a bus 53 in parallel as signal SELIP to the output select circuit 54. The header field is indicative in some way of the output of the crossbar switch, and consequently the output of the routing switch, which the input message packet should be routed to. As will be described in further detail hereinafter, the output select circuit 54 operates in dependence on the selected header field SELIP on bus 53 to set one or more of the signals SELO0 to SELOn on lines 68*a* to 68*n*. The crossbar switch, in response to one or more of the signals SELO0 to SELOn being set, connects the selected input message packet to one or more of the appropriate output signal lines 64*a* to *64 n*, and outputs the message packet as one or more of the output signals OUTPACK0 to OUTPACKn.

Figure 5:
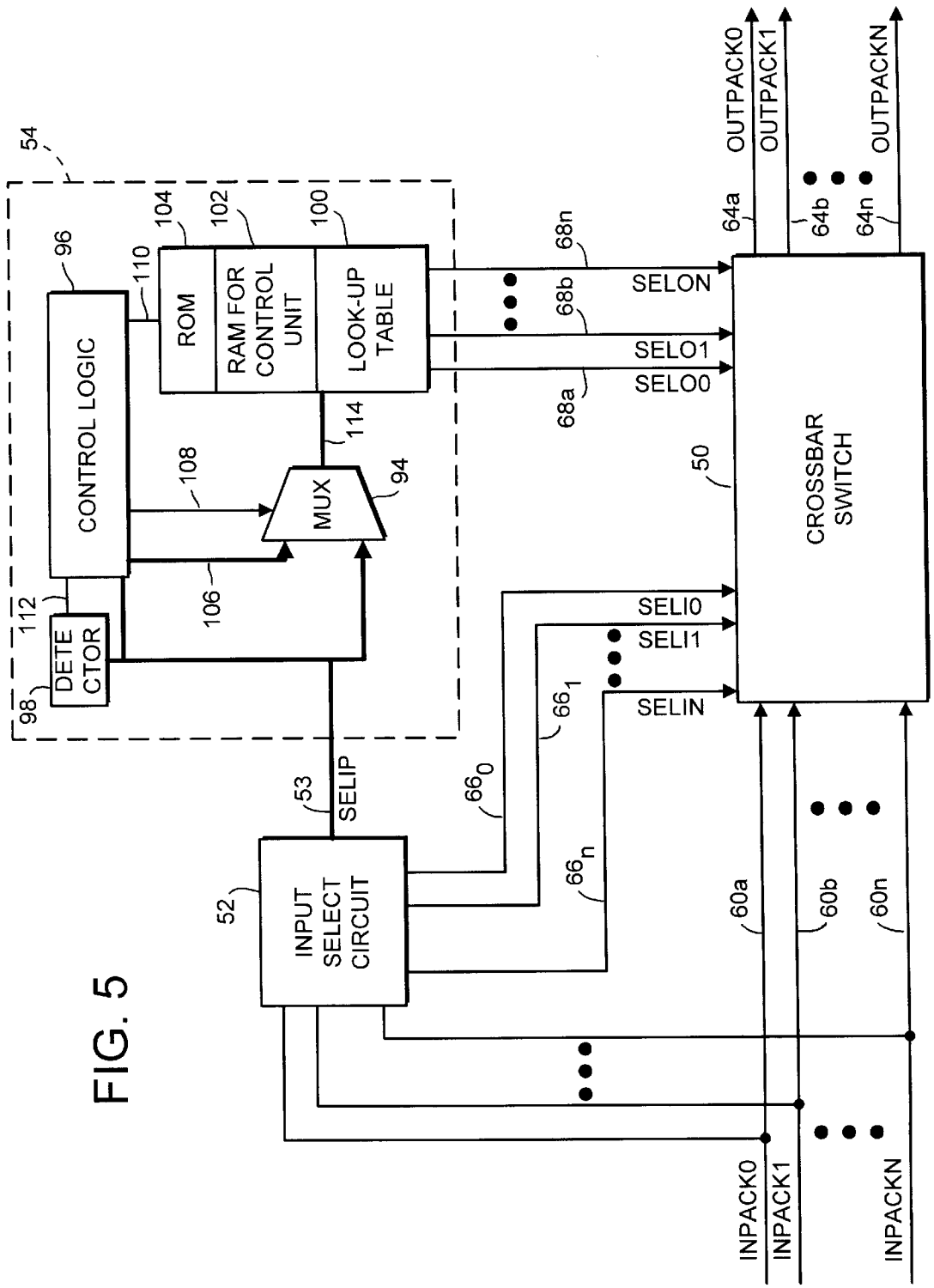
FIG. 5 is a block diagram of a routing switch incorporating means according to the present invention for selecting the output thereof.

Turning now to FIG. 5, there is shown one possible implementation according to the present invention of the output select circuit 54 of the routing switch of FIG. 2. Elements and connections in FIG. 5 which are identical to elements and connections shown in FIG. 2 are referred to by the same reference numerals.

As can be seen from FIG. 5, the output select circuit 54 according to this aspect of the invention comprises control logic 96, a detector block 98, a multiplexor 94, a ROM 104, a RAM 102 and a look-up table 100. The multiplexor 94 receives as one input the selected header field SELIP on bus 53, and as its other input a signal bus 106 which is generated by the control logic 96. One of the two inputs of the multiplexor 94 is connected to the output bus 114 of the multiplexor in dependence upon a control signal on line 108 generated by the control logic 96. The control logic 96 receives as an input the selected header field SELIP on bus 53 and also a signal 112 from the detector 98. The detector 98 receives as an input the selected header field SELIP on line 53. The control logic 96 outputs a signal 11 to the ROM 104, RAM 102 and look-up table 100. The output bus 114 of the multiplexor 94 forms an address input to the memory space formed by the look-up table 100, RAM 102 and ROM 104.

In normal operation of the routing switch, when it is being used merely to route message packets received on its inputs to one or more of its outputs, the multiplexor 94 is controlled by the signal 108 to connect the selected header field SELIP on bus 53 to its output bus 114. The output bus 114 addresses the memory element 100,102,104 and the look-up table occupies the area of memory space addressed by the possible range of header values. Referring to Table I, the contents of the look-up table according to one embodiment of this invention is illustrated.

In this embodiment, described for eight output ports, the look-up table comprises one bit for each output port, plus a single bit X indicating whether the header is to be stripped or not, making nine bits in total. Furthermore, in the specific example described here to help in understanding the present invention, there are 18 possible values of the header byte. Thus, referring to Table I, there is shown that for each of the 18 possible values of the header byte, there are 9 bits: 8 bits associated with each of the 8 output ports of the routing switch, and one, bit associated with whether the header byte is to be stripped or not. Thus the header byte acts as a direct address to the look-up table, and the respective ones of the 8 bits associated therewith stored in the look-up table are output, in the-specific example when the routing switch has 8 outputs, to the respective ones of the signals SELO0 to SELO7 on lines 68*a* to 68 *h*. Thus, Table I shows the routing switch look-up table, which constitutes part of the RAM 102, with one bit column per output port and a number of locations corresponding to possible values of the header byte. In Table I, different header byte values are used to point to different locations in the look-up table which contains one bit per output port and one additional bit for the whole routing switch. The look-up table contains as many words as there are permitted header byte values, so it would have a maximum of 256 words and more likely between 32 and 128 words. further explanation of the operation of the output select circuit 54 will be given in detail hereinafter.

One value of the header byte would be reserved for special control purposes, and conveniently in the present embodiment that value is set as the header byte having a value zero. The detector circuit 98 monitors the selected header field SELIP on the bus 53, and on detection that the byte on the bus 53 is zero, sets the signal 112 to confirm such identification to the control logic. In response to the detection of a zero value header byte, the control logic 96 changes the signal 108 such that the multiplexor 94 connects the bus 106 to its output on bus 114. Thereafter, header bytes on the bus 53 may be input into the control logic 96. The control logic 96 can then output on bus 106 addresses of the look-up table to alter the information contained therein, the data for altering the values of the look-up table being provided on the signal lines 110.

Figure 6:
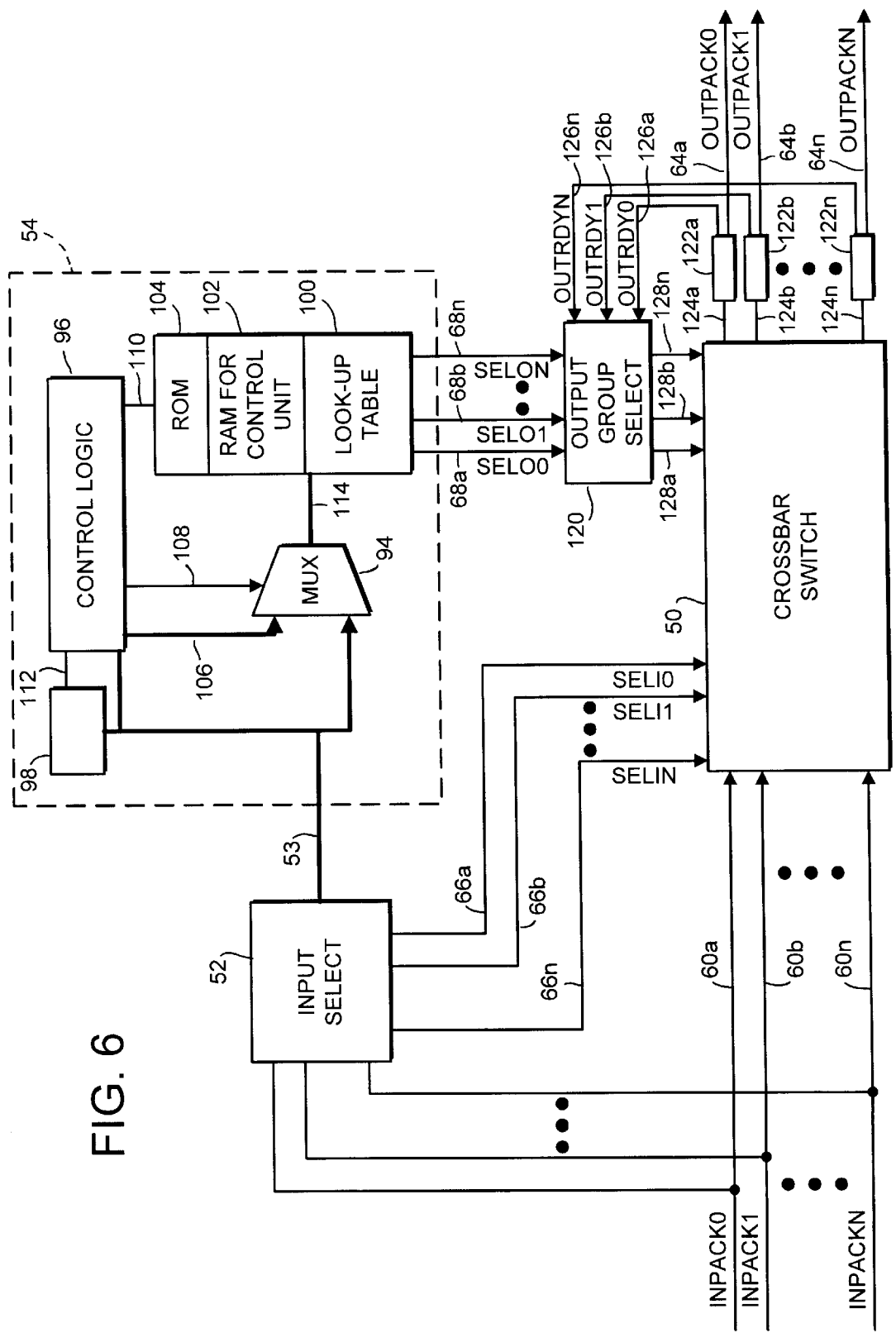
FIG. 6 is a block diagram of a routing switch showing means according to an alternative embodiment of the present invention for selecting an output thereof.

Turning now to FIG. 6, there is shown a further implementation according to the present invention of an output select circuit 54 of the routing switch of FIG. 2. Again, those elements and interconnections in FIG. 6 being identical to the routing switch of FIG. 2 are identified by the same

TABLE I

|  | OP0 | OP1 | OP2 | OP3 | OP4 | OP5 | OP6 | OP7 | x |
|---|---|---|---|---|---|---|---|---|---|
| Header byte = 1 | 1 | 0 | 0 | 0 | 0 | 0 | 0 | 0 | 0 |
| Header byte = 2 | 0 | 1 | 0 | 0 | 0 | 0 | 0 | 0 | 0 |
| Header byte = 3 | 0 | 0 | 1 | 0 | 0 | 0 | 0 | 0 | 0 |
| Header byte = 4 | 0 | 0 | 0 | 1 | 0 | 0 | 0 | 0 | 0 |
| Header byte = 5 | 0 | 0 | 0 | 0 | 1 | 0 | 0 | 0 | 0 |
| Header byte = 6 | 0 | 0 | 0 | 0 | 0 | 1 | 0 | 0 | 0 |
| Header byte = 7 | 0 | 0 | 0 | 0 | 0 | 0 | 1 | 0 | 0 |
| Header byte = 8 | 0 | 0 | 0 | 0 | 0 | 0 | 0 | 1 | 0 |
| Header byte = 9 | 1 | 1 | 1 | 1 | 0 | 0 | 0 | 0 | 1 |
| Header byte = 10 | 0 | 0 | 0 | 0 | 1 | 1 | 0 | 0 | 1 |
| Header byte = 11 | 0 | 0 | 1 | 0 | 0 | 0 | 0 | 1 | 1 |
| Header byte = 12 | 0 | 1 | 0 | 0 | 0 | 0 | 0 | 1 | 1 |
| Header byte = 13 | 1 | 0 | 1 | 0 | 0 | 1 | 0 | 0 | 1 |
| Header byte = 14 | 1 | 1 | 0 | 0 | 1 | 0 | 0 | 1 | 1 |
| Header byte = 15 | 0 | 1 | 0 | 0 | 0 | 0 | 1 | 0 | 1 |
| Header byte = 16 | 0 | 0 | 1 | 1 | 1 | 0 | 0 | 1 | 1 |
| Header byte = 17 | 1 | 0 | 0 | 0 | 0 | 0 | 0 | 0 | 1 |
| Header byte = 18 | 1 | 1 | 1 | 1 | 1 | 1 | 1 | 1 | 1 | reference numerals. It can be seen that the routing switch according to FIG. 6 incorporates all the elements of the routing switch described herein above with reference to FIG. 5, but in addition includes an output group select circuit 120, and output buffer circuits 122a to 122c associated with each of the plurality of outputs of the crossbar switch. The outputs SEL00 to SELOn of the look-up table 100 perform the inputs to the output group select, which generates as outputs signals CONO0 to CONOn on lines 128a to 128n which form inputs to the crossbar switch 50 for controlling which ones of the outputs of the crossbar switch are to be connected to the input of the crossbar switch. The outputs of the crossbar switch are buffered into the output buffers 122a to 122c, which in addition to providing the output message packet signals OUTPACK0 to OUTPACKn on lines 64a to 64n, in this aspect of the present invention also generate signals OUTRDY0 to OUTRDYn respectively on lines 126a to 126n.

The implementation of the output select circuit 54 according to this embodiment of the present invention, provides for the implementation of output port grouping. Such output port grouping provides for higher band width, reduced latency, and redundancy in the event of a link failure.

The output group select circuit 120 of FIG. 6 includes therein a set of "group" registers, one register associated with each output port of the routing switch. In the embodiment described herein to exemplify the invention, the routing switch is taken to have 12 outputs. Referring to Table II, there is shown an example of such a 12 port router, with each of its output ports grouped. Thus it can be seen that there is a group 0 register which identifies that a port 0 is grouped with port 1, a group 1 register which identifies that port 1 is grouped with port 0, a group 2 register which identifies that port 2 is grouped with port 11, and a group 11 register which identifies that port 11 is grouped with group 2. Thus four of the output ports are grouped in ports. It can also be seen that each of output ports 3,4,5 and 6 has a respective group register which identifies that output ports 3,4,5 and 6 are grouped with each other, and each of output ports 7,8,9 and 10 have a group register associated therewith which identifies that each of ports 7,8,9 and 10 are grouped with each other.

been satisfied. Thus, if the look-up table 100 indicates that the output port 3 should be selected, but that the output ready signal OUTRDY3 on line 126d from the output buffer 122d associated with output port 3 indicates that output port 3 is currently busy and not ready to transmit, then the output group select circuit 120 will access the group 3 register to see whether output port 3 is grouped with any other ports, and in the example given in Table II if any one of ports 4,5 and 6 are not busy and ready to transmit, then they can be used instead of the transmit bit in the message packet.

Figure 7:
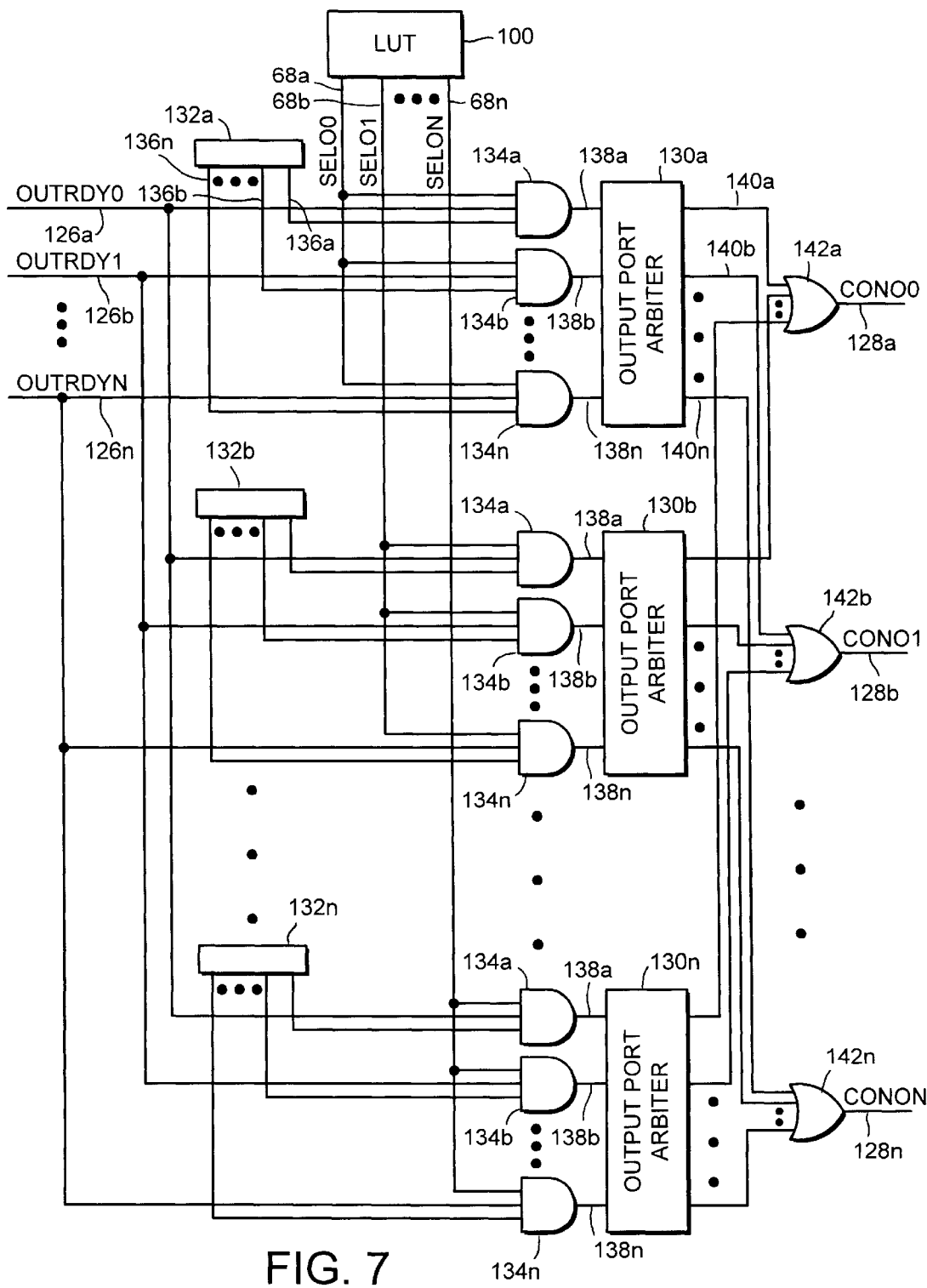
FIG. 7 is a block diagram exemplifying the circuitry shown in FIG. 6 for selecting a group of outputs of the routing switch.

Referring to FIG. 7, there is shown a specific implementation of output group select circuit 120. The output group select circuit 120 comprises each of the group registers 132a to 132n, and in the specific embodiment implementing Table II there will be 12 such registers storing the respective bits as shown in Table II. The signals CONO0 to CONOn on lines 128a to 128n are generated by respective OR gates 142a to 142n. Each of the respective OR gates 142a to 142n is associated with a respective output port arbiter 130a to 130n. Each output port arbiter 130a to 130n has associated therewith an n plurality of AND gates 134a to 134n.

Each group register 132 generates n outputs associated with the n output ports, each one of the respective n output bits forming an input to the n AND gates 134a to 134n. In addition, each AND gate 134a to 134n associated with any one of the group registers 132 receives an additional input on one of the respective output ready signals OUTRDY0 to OUTRDYn from the corresponding one of the output buffers 122a to 122n. All of the AND gates associated with the group register 132a which is the group register associated with output port 0, receive the signal SEL00 from the look-up table 100 indicating selection of output port 0. Similarly, each of the set of AND gates associated with the other output group registers will receive the bit from the look-up table 100 associated with whether that output port is selected or not. The output of the AND gates 134a to 134n are input on lines 138a to 138n respectively to the output port arbiters 130a to 130n on respectively. The output port arbiters determine, in the event that more than one of the input lines 138a to 138n is set, which will be set at its output on lines 140a to 140n. The output on lines 140a to 140n of each of the output port arbiters 130a to 130n form respective inputs to the NOR gates 142a to 142n.

TABLE II

| | OP 0 | OP 1 | OP 2 | OP 3 | OP 4 | OP 5 | OP 6 | OP 7 | OP 8 | OP 9 | OP 10 | OP 11 |
|---|---|---|---|---|---|---|---|---|---|---|---|---|
| Group 0 Register | 1 | 1 | | | | | | | | | | |
| Group 1 Register | 1 | 1 | | | | | | | | | | |
| Group 2 Register | | | 1 | | | | | | | | | 1 |
| Group 3 Register | | | | 1 | 1 | 1 | 1 | | | | | |
| Group 4 Register | | | | 1 | 1 | 1 | 1 | | | | | |
| Group 5 Register | | | | 1 | 1 | 1 | 1 | | | | | |
| Group 6 Register | | | | 1 | 1 | 1 | 1 | | | | | |
| Group 7 Register | | | | | | | | 1 | 1 | 1 | 1 | |
| Group 8 Register | | | | | | | | 1 | 1 | 1 | 1 | |
| Group 9 Register | | | | | | | | 1 | 1 | 1 | 1 | |
| Group 10 Register | | | | | | | | 1 | 1 | 1 | 1 | |
| Group 11 Register | | | 1 | | | | | | | | | 1 |

Figure 8:
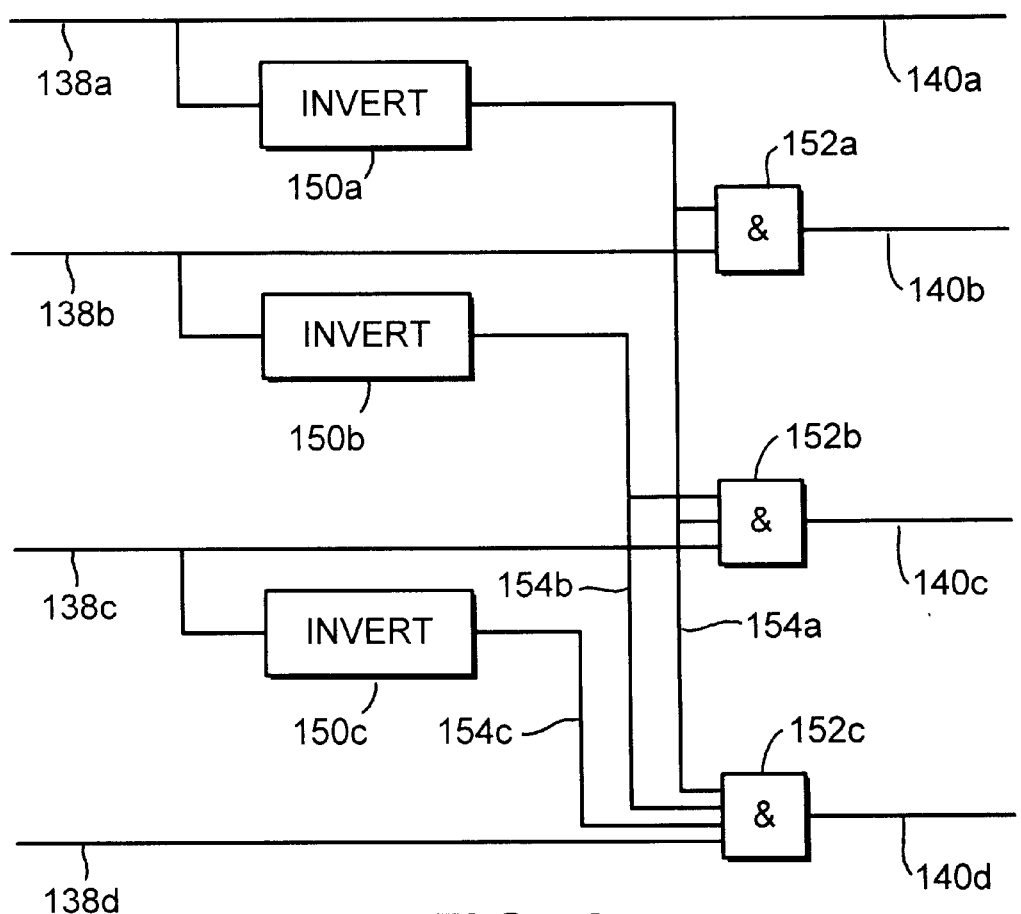
FIG. 8 illustrates circuitry for implementing an arbiter for selecting between outputs in a group.

Thus, when the look-up table in the output group select circuit 120, as illustrated in Table II, indicates that a destination "x" is to receive a message, the group "x" register is used to determine which port or ports can be used for the transfer. When any one or more of the ports indicated by the register is ready, then the request for destination "x" has Turning now to FIG. 8, there is shown an implementation of each of the output port arbiters 130a to 130n. For the purposes of explanation, in FIG. 8 it is assumed that there are four output ports. The output port arbiter 130 merely determines that, in the event that more than one of the input signals 138a to 138d is set, which of the output ports will be enabled in accordance with their predetermined priority associated with each physical output port. The basic arbitration process used is that output port 0 has the highest priority and output port n has the lowest priority. The four output port implementation illustrated in FIG. 8 comprises three inverters 150*a* to 150*c*, and three AND gates 152*a* to 152*c*. If the bit 138*a* is set then it is output directly as the bit 140*a*, and its inverse forms an input to each of the inverters 152*a* to 152*c* to ensure that each of the lines 140*b* to 140*d* is then not set. If the bit 138*a* is not set however, then its inverse forms an enable signal to each of the AND gates 152*a* to 152*c*. Similarly, it will be apparent to one skilled in the art how the one of the input signals 138*a* to 138*d* which is set will control which of the outputs 140*a* to 140*d* is set. If none of the signals 138*a* to 138*c* are set, then the AND gate 152*c* will operate such that the output 140*d* is set if the input 138*d* is set.

As has been mentioned hereinabove, a message packet in a network may be required to be routed from a single source node to a single destination node or from a single source note to multi-destination nodes. A message packet which is required to go from a single source to a single destination is known as a uni-cast packet, whereas a message packet which is required to go from a single source to multiple destinations is known as a multi-cast packet. Referring back now to FIG. 1, a uni-cast packet or cell might start from node A, go through the route switch 2 to switch E, and through daisy-chain node EBA to arrive at its destination EBB. The simplest way to route this packet/cell is with a multiple byte header such as that shown in FIG. 3, the first byte of which header 0 is used by the route switch to select the output to E. The second header byte, header 1, is used by E to select the output for EBA, and the third header byte, header 2 is used by EBA to select the output for EBB. With this approach each node, whether a switch or daisy-chained node, would strip the first byte of the header before forwarding the packet/cell to the next node. Of course when a header is described as a byte, this could be any size of field, but a byte of 8 data bits is a convenient size.

Another packet/cell might be multicast from FA to B, FC and DAA. In this case if there were multiple bytes of header, different destinations would receive the packet/cell with different sizes of header. So in this multicast case, it is desirable to use a single header throughout the network. Thus, it is proposed that according to the present invention message packets will be routed through a routing network using two different types of header format dependent upon whether the message packet is a unicast or multicast packet. The packet/cell format used according to the present invention is that if a message packet is unicast, then it is provided with multiple header bytes with the front byte of the header stripped at each switch or daisy-chain node, and if the message packet is for multicast transmission, it is provided with a single header byte which is never stripped. These two possible implementations are shown in FIGS. 3 and 4 as described herein above.

Referring again to Table I herein above, it is shown that a bit x is set in the look-up table 100 to indicate whether a header associated with a message packet is to be stripped or not. Whether a message packet is unicast or multicast is determined by whether one or more output ports is set to one in the corresponding entry in the routing look-up table.

It should be noted that in Table I header byte value 18 is set to broadcast to all of the output ports, this is shown for completeness but in fact in an implementation it may be made a illegal value. At initialisation, the look-up table of Table I would be set as shown for header byte values 1 to 8, and all of the locations would be initialised to 0. If the switch had more than eight ports, more values would be set on initialisation.

For unicast packets, only one header byte value is needed per output port, and if any output port is unused, fewer unicast header byte values are needed than output ports. For grouped ports, similarly, if the routing switch is being used as a four port switch, say, with four groups of four ports, only four uni-cast header byte values are needed to identify which group.

There are several possible options for stripping headers, but in the preferable embodiment of the present invention described herein a simple approach of stripping unicast headers and retaining multicast headers is used. As described herein above, a special header byte value 0 is preferably used to address logic inside the routing chip, specifically the control logic 96. This avoids the need for a special network of control links.

Internal logic accessible from this control header byte value includes:

the look-up table 100;

the fixed information about the device, preferable in ASCII as it would appear on a screen to be used, possibly coded in some way compatibly with open boot or with IEEE 1212 or with CEBus or CAN;

a writable register or RAM which holds the node ID allocated by a process which maps the network.

In the embodiment described hereinabove, the look-up table 100, ROM 104, and RAM 102 have been combined into a RAM/ROM. It will be envisaged however that they need not necessarily be combined in this way but may be distinct memory entities.

In the special case when the header byte of the incoming message packet has a value 0 the input port is connected directly to the control logic 96 rather than to an output port. The control logic is then able to generate addresses for the ROM/RAM/look-up table, for example to read the ROM or write or read the RAM/look-up table. There will also be a connection, not shown in the above figures, so that the control logic can be connected to an output port so that it can return the result of reading the ROM or RAM/look-up table.

As described hereinabove with reference to FIGS. 3 and 4, message packets transmitted through a routing network preferably include a checking field 88. One advantageous technique for generating the checking field in message packets where headers are deleted (and added) as they traverse their route, is by using a longitudinal parity checksum. In such a scheme, the payload portion is split into a number of sets of information, each set of information having the same number of bits as the header portion and terminator portion. Respective bits of each set of information are then added using modulo two arithmetic, and the resulting bits are put together as a set of checking information and appended to the message packet. This method is particularly appropriate to a system where routing headers are added or deleted, because a corrected checksum can be generated on deletion or addition of a header by exclusive ORing the current checksum with the header byte which has been deleted or added.

Furthermore, a message may be made up of a number of packets, and the order of the packets in the message can be important. However, when routing the message packets through a network, message packets are often separated and then put back together at a later point in the network. It is important that the message packets are put back together in the correct order and that the sequence is not lost, and therefore some means of being able to check at a destination node that the message packets have been received in the correct order would be desirable. Particularly, such a method of checking the sequence of received message packets should be incorporated into a coding scheme without lengthening the message packets.

Figure 9:
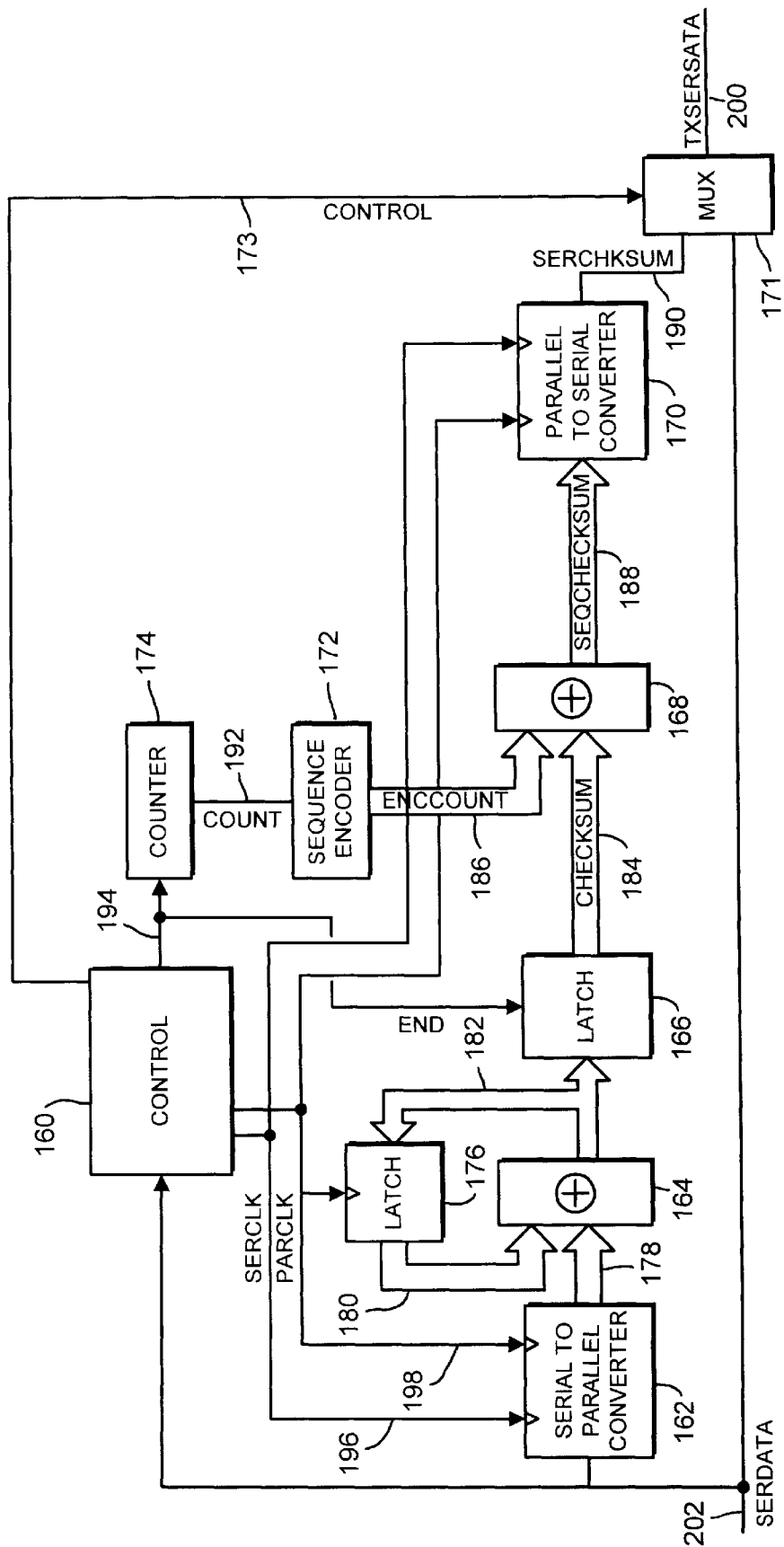
FIG. 9 is a block diagram illustrating circuitry for generating a checksum including information concerning the sequence of a message packet in a message.

Thus according to this aspect of the present invention the advantageous longitudinal parity checksum generation is used to provide a sequence check. FIG. 9 illustrates circuitry for generating the appropriate checksum, and FIG. 10 illustrates an exemplary embodiment of the generation of a checksum and its checking-at its destination node.

The checksum generation circuitry as shown in FIG. 9 includes a control circuit 160, a serial to parallel converter 162, a latch 176, a set of exclusive OR gates 164, a latch 166, a set of exclusive OR gates 168, a parallel to serial converter 170, a multiplexor 171, a counter 174, and a sequence encoder 172. A serial data message packet to be transmitted SERDATA is received by the checksum encoder on line 202 and input to the serial to parallel converter 162. The serial to parallel converter receives a serial clock SERCLK on line 196 from the control circuit 160, and a parallel clock PARCLK on line 198 from the control circuit 160. In this embodiment, and for the purposes of description, it will be assumed that the checksum generated is a checksum byte, and thus the serial data is converted by the serial to parallel converter 162 into bytes on bus 178. Thus, the parallel clock PARCLK will be operating at an eighth of the speed of the serial clock SERCLK. The parallel bytes of the serial data signal on line 178 form respective first inputs to a set of eight exclusive OR gates in the block 164. The outputs of the exclusive OR gates in the block 164 generate the bus 182. The respective eight signals on bus 182 form respective inputs to eight latches in the latch 176, the outputs of the eight latches in the latch 176 being generated on the bus 180 to form second inputs to the set of eight exclusive OR gates in the block 164. Thus, the output of the block 164 on bus 182 is the running modulo two arithmetic sum of successive bytes of the serial data signal SERDATA. The serial data signal 202 also forms an input to the control signal 160, and when the control circuit 160 identifies a terminator portion at the end of a message packet, it sets the control signal END on line 194 to latch the latch 166, thus the checksum for the whole of the message packet is output on bus 184 as the signal checksum. The output signal END from the control circuit 160 is also input to a counter 174, which successively counts the number of times the END signal is set thus, after the checksum for the first message is generated, the counter 174 will count to one and generate a count of one as its output count on the signal line 192. The sequence encoder 172 encodes the count into a byte as the signal ENCCOUNT on bus 186, to provide the same number of bits as there are in the checksum on the bus 184. Respective bits of the checksum 184 are then exclusive ORed by a block of eight exclusive OR gates in the block 168 with the eight bits on the bus ENCCOUNT to generate the signal SEQCHKSUM on bus 188, being the longitudinal parity checksum associated with the message packet with the sequence number of the message packet encoded therein. The SEQCHKSUM on bus 188 is converted into serial format via the parallel to serial converter 170 and presented on signal line 190 as the signal SERCHKSUM to one input of the multiplexor 171. The other input of the multiplexor 171 is provided by the signal serial data SERDATA on line 202. Thus, when the last bit of the message packet on line 202 has been transmitted by the multiplexor 171 onto the transmit serial data TXSERDATA line 200, the control circuit 160 sets the control signal 173 so that the signal SERCHKSUM is connected to the signal TXSERDATA and the checksum is added to the appropriate portion of the message packet.

From the above description, it will be appreciated that as successive checksums for each message packet are generated, the counter generates successively higher counts which are encoded into the checksum.

With reference to FIG. 10, a specific example will now be described to help understand this invention.

As can be seen in FIG. 10a, the sequence number of the particular packet or cell to be transmitted is 2, and this is encoded by the sequence encoder 172 in two half bytes as 2, such that the encoded sequence number is 00100010. The header byte is 55, the channel ID byte is 1F, the first data byte is BC, and the second and last data byte is 01. All the above bytes are added using modulo two arithmetic, which is equivalent to ensuring that the number of ones in each column is even, to give the checksum for the message packet including the sequence number.

Referring to FIG. 10b, there is illustrated the message packet in the form in which it is transmitted, as can be seen, there is no indication from FIG. 10b that the message packet includes information concerning the sequence number of the packet, since no additional bits or bytes have been added to the message packet as transmitted.

Referring to FIG. 10c, in this example the header byte 55 is stripped from the message packet. Thus, the header byte 55 is added to the original checksum transmitted with the message packet to generate a revised checksum.

FIG. 10d then shows the message packet as received with the header byte deleted and the revised checksum included therein. In order to retrieve the sequence number of the message packet at the receive end, each column of the received message packet, including the revised checksum, is exclusive ORed such that the result of the exclusive OR operation gives the encoded sequence number of the message packet. By decoding the sequence number at the receive end the controller can determine the correct sequence number of the message packet.

Thus, according to this aspect of the invention, an additional level of checking is encoded into the message packet without increasing the overheads of the message packet, such as the size of any of the header or terminator portions of the packet, or the length of the packet in total.

As can be seen from FIG. 2 hereinabove, the routing switch has a plurality of inputs, and it is possible that more than one routing switch may simultaneously receive a message packet to be routed. In such cases, the input select circuit 52 is provided so as to arbitrate between the input ports receiving a message packet so that the message packets are routed in order. As a result of an arbitration decision generated by the input select circuit 52, a selected one of the input ports is routed by the crossbar circuit 50.

In a basic implementation of such a routing switch, the arbitration between the input ports is arbitrary as far as priority is concerned, and if there were to be any priority it would be for one input port over another.

Figure 11:
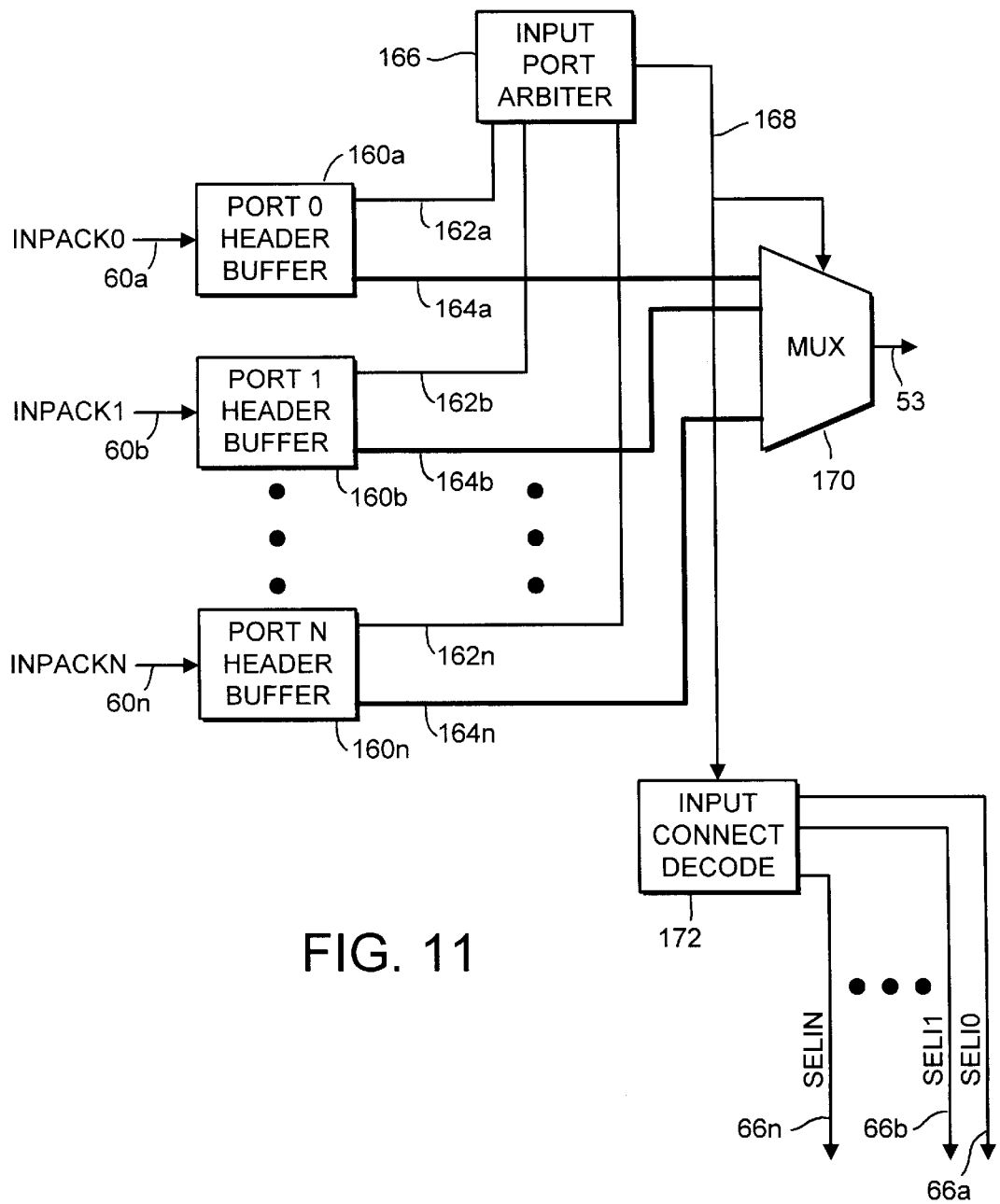
FIG. 11 is a block diagram of circuitry shown in FIG. 2 for selecting the inputs of a routing switch.

Referring to FIG. 11, there is illustrated a block diagram of one implementation of the input select circuit 52 of the routing switch which exemplifies an arbitrary selection between multiple input message packets.

Referring to FIG. 11, it can be seen that each of the input message packets INPACK0 to INPACKn on lines 60a to 60c is input to a respective port header buffer 160a to 160c. Each input port header buffer 160a to 160n generates the header byte associated with the incoming message packet on a respective one of the buses 164a to 164n, and also generates a signal indicative of the fact that a message packet is waiting to be routed on one of the lines 162a to 162n. Each of the signals indicative of the fact that an input port has a message packet to be routed on lines 162a to 162n is inputted to the input arbiter 166, and in dependence on some arbitration included in the input port arbiter 166, an output is generated on lines 168 which indicates which of the input ports is to be routed first. This signal controls the multiplexor 170 to select one of the header bytes on lines 164a to 164n to be connected to its output bus 53 for connection to the output select circuit 54, and also is connected to the input connect decode circuit 172, which sets an appropriate one of the select input signals SELI0 to SELIn on lines 66a to 66n to, as above described, select the appropriate one of the input ports.

Figure 13:
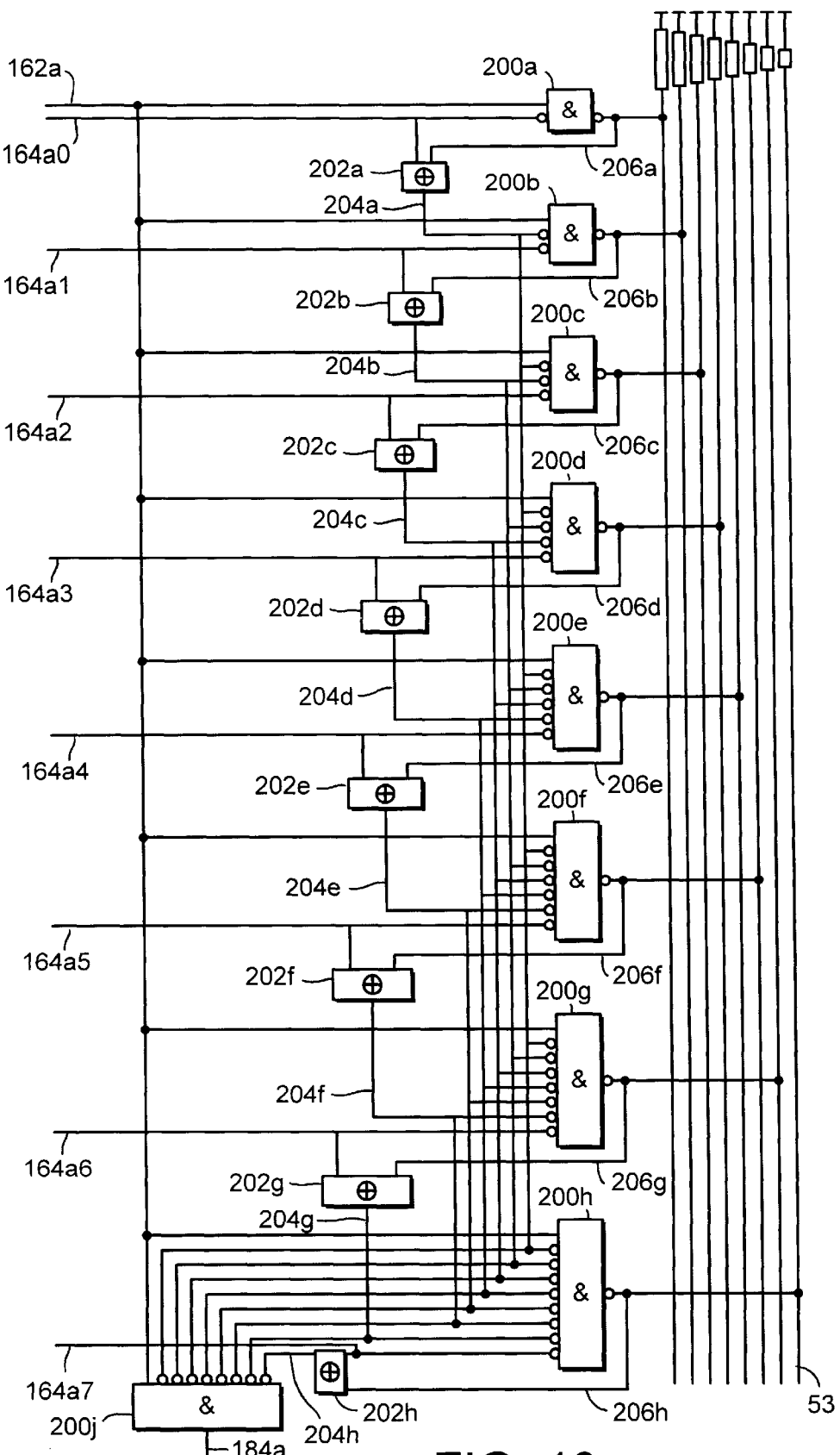
FIG. 13 illustrates example circuitry for selecting between multiple inputs of a routing switch based on the header of the respective message packets at the inputs.

Although such an arbitrary selection between input ports deals with any conflict when more than one message packet is required to be routed through the routing switch, it is desirable in some cases to have the arbitration based on the priority of the incoming header byte value. Referring to Table III, there is shown the table of Table I but redrawn as such that different header byte values are shown in priority order, with the highest priority at the top and identified as header byte 1. Table I still shows one header byte value, 11, which has a single bit set to indicate routing to a single output port indicating a unicast message packet, but which has the bit x set to indicate the header is not to be stripped.

being associated with each of the respective input port header buffers 160a to 160n. The construction of the header output circuits 182a to 182n is described in FIG. 13, and is such that each outputs directly onto the output bus 53 such that the header having the highest priority will have control of the bus. Reverting to FIG. 13, the operation of the header output circuits 182a to 182n will be described with reference to the first one of these circuits 182a.

The signal on line 162a indicating that the input port 0 has an input message packet to be routed acts as an enable signal for a set of open drain AND gates 200a to 200j. Each bit of the header byte of the input message packet associated with that input port forms a second input to each of the respective open drain AND gates 200a to 200h, each of these inputs being inverted at the inputs of the respective AND gates. The AND gate 200a associated with the least significant bit receives as its inputs only these two described inputs. The output of the AND gate 200a associated with the least significant bit of the header byte forms the least significant bit of the bus 53, and also an input to an exclusive OR gate 202a which receives as its second input the bit of the header byte input to the AND gate 200a. Similarly, the outputs of each of the other AND gates 200b to 200h form one input to respective exclusive OR gates 202b to 202h, the other input of these exclusive OR gates being formed by the respective bit of the header byte at the first input port applied to the

TABLE III

|                   | OP0 | OP1 | OP2 | OP3 | OP4 | OP5 | OP6 | OP7 | x |
|---|---|---|---|---|---|---|---|---|---|
| Header byte = 1   | 1 | 0 | 0 | 0 | 0 | 0 | 0 | 0 | 0 |
| Header byte = 2   | 0 | 0 | 1 | 1 | 1 | 0 | 0 | 1 | 1 |
| Header byte = 3   | 0 | 0 | 1 | 0 | 0 | 0 | 0 | 0 | 0 |
| Header byte = 4   | 0 | 0 | 0 | 1 | 0 | 0 | 0 | 0 | 0 |
| Header byte = 5   | 0 | 0 | 1 | 0 | 0 | 0 | 0 | 1 | 1 |
| Header byte = 6   | 0 | 1 | 0 | 0 | 0 | 0 | 0 | 1 | 1 |
| Header byte = 7   | 1 | 0 | 1 | 0 | 0 | 1 | 0 | 0 | 1 |
| Header byte = 8   | 0 | 0 | 0 | 0 | 0 | 0 | 0 | 1 | 0 |
| Header byte = 9   | 1 | 1 | 1 | 1 | 0 | 0 | 0 | 0 | 1 |
| Header byte = 10  | 0 | 0 | 0 | 0 | 1 | 1 | 0 | 0 | 1 |
| Header byte = 11  | 1 | 0 | 0 | 0 | 0 | 0 | 0 | 0 | 1 |
| Header byte = 12  | 0 | 0 | 0 | 0 | 1 | 0 | 0 | 0 | 0 |
| Header byte = 13  | 0 | 0 | 0 | 0 | 0 | 1 | 0 | 0 | 0 |
| Header byte = 14  | 1 | 1 | 0 | 0 | 1 | 0 | 0 | 1 | 1 |
| Header byte = 15  | 0 | 1 | 0 | 0 | 0 | 0 | 1 | 0 | 1 |
| Header byte = 16  | 0 | 0 | 0 | 0 | 0 | 0 | 1 | 0 | 0 |
| Header byte = 17  | 0 | 1 | 0 | 0 | 0 | 0 | 0 | 0 | 0 |
| Header byte = 18  | 1 | 1 | 1 | 1 | 1 | 1 | 1 | 1 | 1 |

Thus, there is a need to implement in the input select circuit 52, logic which enables the determination of which one of a plurality of input message packets requires to be routed is routed first in accordance with the priority status allocated by a look-up table such as that shown in FIG. 3.

Figure 12:
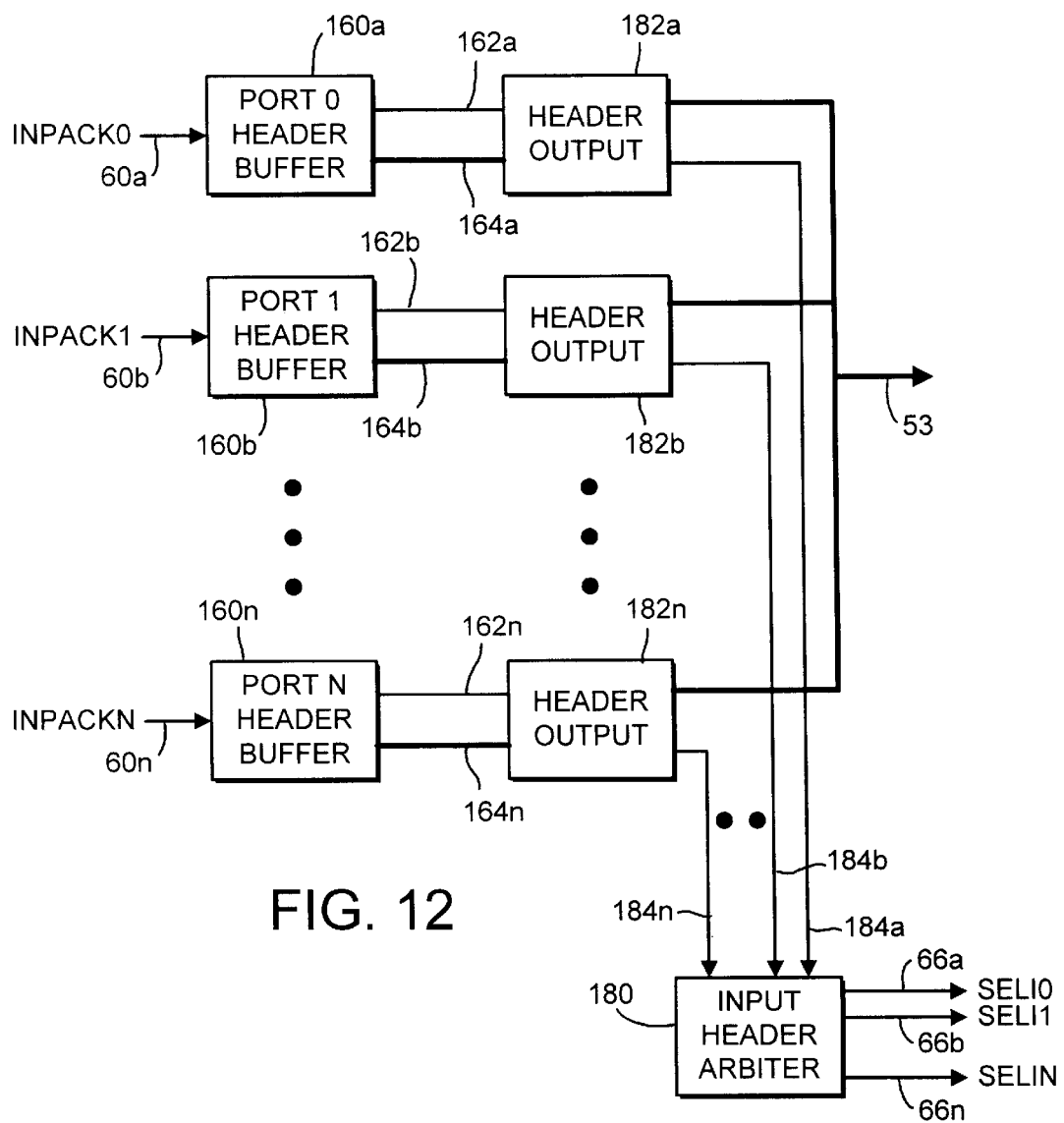
FIG. 12 is an alternative block diagram of circuitry as shown in FIG. 2 above for selecting the input of a routing switch.

Referring now to FIG. 12, there is shown a block diagram of an input select circuit 52 according to this aspect of the present invention for enabling the selection of the input message to be routed in dependence upon the header value of the various input messages received at the input ports.

The input select circuit 52 according to this embodiment of the invention still includes an input port header buffer 160a to 160n associated with each incoming input packet message INPACK0 to INPACKn, and each of which generates a respective signal indicative of the presence of an input message to be routed on lines 162a to 162n respectively, and its header byte value on buses 164a to 164n respectively. Each of the respective signal lines 162 and the respective buses 164 forms an input to a respective header output circuit 182, a header output circuit 182a to 182n AND gate associated with that exclusive OR gate. The exclusive OR gate associated with each bit of the header byte generates outputs on lines 204a to 204h respectively, and each output of each exclusive OR gate forms an input to the AND gate associated with each more significant bit of the header byte, inverted prior to application to the AND gate.

In this way, AND gates 200a to 200h generate the respective eight bits of the bus 53, and AND gate 200j generates on line 184a the signal indicating that the header byte of that input port has been selected.

A zero output onto any bit of the bus 53 always overrides a high level output onto that same bit. Only if all the inputs to the AND gate 200j indicate that the AND gates 200a to 200h have been able to set their header value low on the bus 53 will signal 184a be set. Thus, it will be appreciated that the one of the header output circuits 182b associated with the current input message packet having the highest priority will be able to output that message packet's header byte onto the bus 53, and set the appropriate one of the signals 184a to 184h to the input header arbiter 180. Even with this arbitration on the header byte values from each input port, it is possible for two or more input ports to present the same header byte value, therefore having the same priority level. The input header arbiter 180 is provided to select the appropriate input port when such a situation arises. An implementation of the input header arbiter 180 is shown in FIG. 14.

Figure 14:
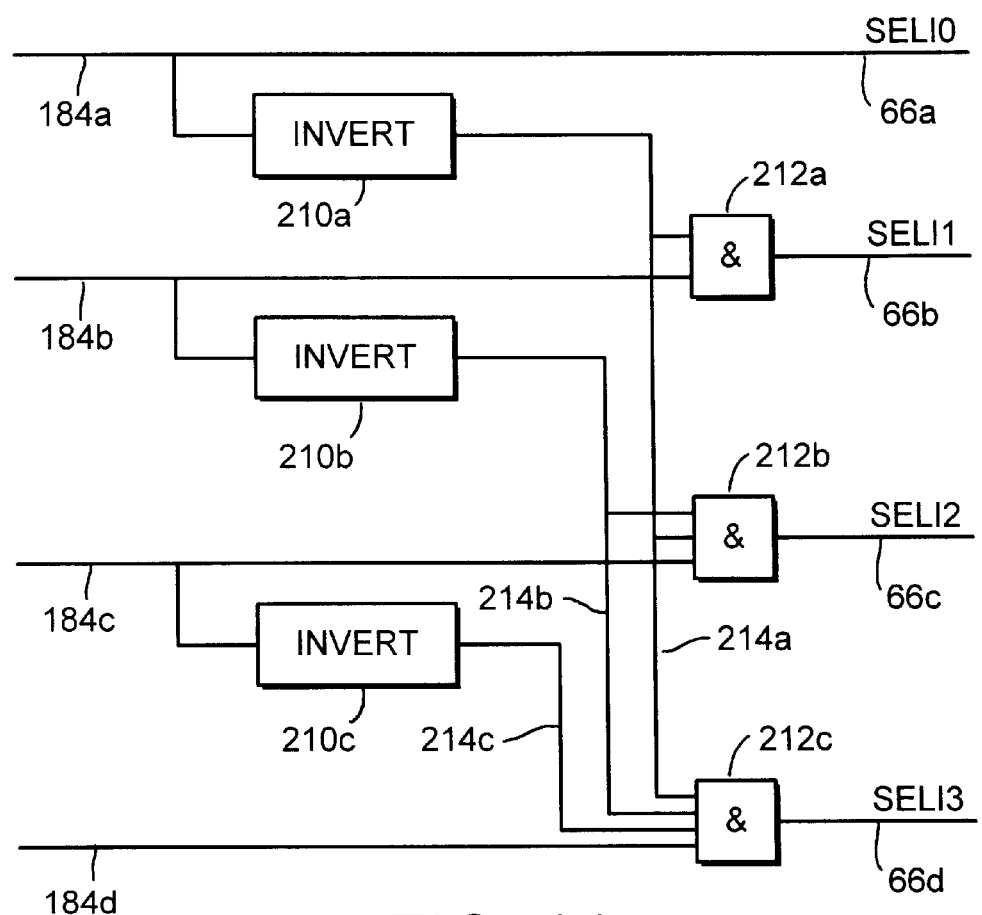
FIG. 14 illustrates arbitration circuitry for selecting between more than one selected output having the same priorities.

Turning now to FIG. 14, there is shown an implementation of the input header arbiter 180. For the purposes of explanation, in FIG. 14 it is assumed that there are four input ports. The input header arbiter 180 merely determines that, in the event that more than one of the input signals 184a to 184d is set, which of the input ports will be enabled in accordance with their predetermined priority associated with each physical input port. The basic arbitration process used is that input port 0 has the highest priority and input port n has the lowest priority. The four output port implementation illustrated in FIG. 14 comprises three inverters 210a to 210c, and three AND gates 212a to 212c. If the bit 184a is set then it is output directly as the bit 66a, and its inverse forms an input to each of the inverters 212a to 212c to ensure that each of the lines 66b to 66d is then not set. If the bit 184a is not set however, then its inverse forms an enable signal to each of the AND gates 212a to 212c. Similarly, it will be apparent to one skilled in the art how the one of the input signals 184a to 184d which is set will control which of the outputs 66a to 66d is set. If none of the signals 184a to 184c are set, then the AND gate 212c will operate such that the output 66d is set if the input 184d is set.

What is claimed is:

1. A method of routing a message packet from an input to at least one of a plurality of outputs of a routing switch, the message packet including a header indicative of the at least one of the plurality of outputs of the routing switch to which the message packet is to be routed, the method comprising the steps of:

storing in a first storage circuit of a routing switch a plurality of sets of routing information, each set being associated with a predetermined value of the header;

accessing a stored set of routing information in dependence on the header of the message packet to be routed;

accessing a second storage circuit responsive to the stored set of routing information, said second storage circuit holding a plurality of sets of grouping information, each set being associated with one output of the routing switch, wherein for each output the set of grouping information groups other outputs of the routing switch which are additionally suitable for transmitting any message packet which may be transmitted on that output; and routing the message packet to the at least one of the plurality of outputs in dependence on the accessed set of routing information, wherein the routing switch has a plurality of outputs suitable for outputting the message packet, the method further comprising the step of routing the message packet to any one of a group of suitable outputs if the accessed set of routing information indicates that the message packet is to be routed to a particular one of the plurality of outputs.

2. The method of claim 1, wherein the plurality of outputs suitable for outputting the message packet includes a plurality of outputs connected to a common destination node.

3. The method of claim 1, wherein each set of routing information includes a strip bit indicative of whether the associated header is to be stripped.

4. The method of claim 3, wherein if the message packet is for transmission to a plurality of destinations, the strip bit is not set.

5. The method of claim 3, wherein if the message packet is for transmission to a single destination, the strip bit is set.

6. A routing switch having a plurality of inputs for receiving message packets each message packet including a header indicative of at least one of a plurality of outputs of the routing switch to which the message packet is to be routed, the routing switch comprising:

first storage circuitry for storing a plurality of sets of routing information, each set being associated with a predetermined value of the header;

first addressing circuitry responsive to the header of the message packet to be routed and for accessing the stored set of routing information associated therewith;

connection circuitry for routing the message packet to the at least one of the plurality of outputs in dependence on the accessed set of routing information;

second storage circuitry for storing a plurality of sets of grouping information, each set being associated with one output of the routing switch, wherein for each output the set of grouping information groups other outputs of the routing switch additionally suitable for transmitting any message packet which may be transmitted on that output;

second addressing circuitry, responsive to the stored set of routing information, for accessing the identity of each output in the group associated with the one output; and selection circuitry for selecting one of the outputs in the group for outputting the message packet.

7. The routing switch of claim 6, wherein the first storage circuitry includes a strip bit associated with each set of routing information indicative of whether the header is to be stripped.

8. The routing switch of claim 7 further including header deletion circuitry for stripping the header in dependence on the strip bit.

9. A method of routing a message packet, including a header, from an input to an output of a routing switch, the method comprising the steps of:

storing a plurality of sets of routing information in a routing switch, each set being associated with one value of the header and wherein each set of routing information includes a strip bit indicative of whether the associated header is to be stripped;

accessing a stored set of routing information in dependence on the header of the message packet to be routed; and routing the message packet to one of a plurality of outputs of the routing switch in dependence on the accessed set of routing information, whereby the associated header is stripped from the message if the strip bit of the accessed routing information is set, wherein if the message packet is for transmission to a plurality of destinations, the strip bit is not set.

10. A method of routing a message packet from an input to an output of a routing switch, the message packet including a header indicative of at least one output of the routing switch to which the message packet is to be routed, wherein the routing switch has a plurality of outputs suitable for transmitting the message packet, the method comprising;

storing a plurality of sets of grouping information, each set being associated with one output of the routing switch, wherein for each output the set of grouping information groups other outputs of the routing switch additionally suitable for transmitting any message packet which may be transmitted on that output;

outputting from the stored grouping information the identity of each output in the group associated with the indicated output; and selecting an output in said group in dependence upon signals indicating which of the outputs in the group are ready to receive data for outputting.

11. The method of claim 10, wherein if more than one of the plurality of outputs is not in use the output for routing the message packet is selected arbitrarily.

12. A routing switch having a plurality of inputs for receiving message packets, each message packet including a header indicative of at least one of a plurality of outputs of the routing switch to which the message packet is to be routed, the routing switch comprising:

storage circuitry for storing a plurality of sets of grouping information, each set being associated with one output of the routing switch, wherein for each output the set of grouping information groups other outputs of the routing switch additionally suitable for transmitting any message packet which may be transmitted on that output;

addressing circuitry, responsive to the header of the message packet to be transmitted, for outputting the identity of each output in the group associated with the indicated output; and selection circuitry for selecting one of the outputs in the group for outputting the message packet, wherein the selection circuitry is an arbiter circuit for selecting one of the outputs in the group in dependence on priority levels allocated to each output.

13. A method of allocating headers to message packets serially output from a source node, the message packets being routed through a succession of routing switches to a destination node, the method comprising the steps of:

allocating a plurality of headers to the message packet if the message packet is to be routed to one destination node, the plurality of headers each being associated with a respective one of the successive switches in the route for routing the message packet;

allocating a single header to the message packet if the message packet is to be routed to a plurality of destination nodes, the single header being associated with each routing switch in the route for the message packet;

storing a plurality of sets of routing information, each set being associated with one value of the header;

accessing a stored set of routing information in dependence on the header of the message packet to be routed; and routing the message packet in dependence on the accessed set of routing information, wherein the routing switch has a plurality of outputs suitable for outputting the message packet, the method further comprising the steps of routing the message packet to any one of a group of suitable outputs if the set of routing information indicates that the message packet is to be routed to a particular one of the plurality of outputs.

14. The method of claim 13, wherein the information portion includes at least one set of header bits.

15. A method of transmitting a message packet in a routing network including the method of claim 13.

16. A method of encoding in a message packet the sequence number of the packet in the message, the message packet comprising a plurality of sets of information bits constituting an information portion and a set of checking bits, all sets containing the same number of bits and each checking bit having been generated by taking the logical sum of bits in all of the sets having the same significance, the method comprising the steps of:

determining the sequence number of the packet;

converting the sequence number into a set of sequence bits having the same number of bits as the sets of information bits and the set of checking bits; and modifying the checking bits by taking the logical sum of the set of checking bits and the set of sequence bits.

17. Circuitry for encoding the sequence number of a message packet in a message in the message packet, the message packet comprising a plurality of sets of bits constituting an information portion of the packet and a set of checking bits, each checking bit having been generated by taking the logical sum of bits in all the sets having the same significance, said circuitry comprising:

an input circuit for receiving the message packet;

a counter for determining the sequence number of the packet;

a converter for converting the sequence number into a set of bits having the same number of bits as the sets of information bits and the checking bits; and means for modifying the checking bits by taking the logical sum of the set of checking bits and the set of sequence bits.

18. Circuitry according to claim 17 wherein the means for modifying includes exclusive-OR means.

19. A routing switch comprising circuitry according to claim 17.

20. A routing switch having a plurality of inputs and a plurality of outputs comprising:

input circuitry for receiving message packets on the plurality of inputs, each message packet including a header having a priority level associated therewith;

header arbitration circuitry for receiving the header of each received message packet and for generating a priority signal indicative of the message packet having the highest priority header;

connection circuitry, response to the priority signal, for routing the received message packet including the header having the highest priority; and output circuitry for outputting the message packet to be routed to at least one of the plurality of outputs.

21. The routing switch of claim 20 further comprising:

input arbitration circuitry, for receiving the priority signal, wherein if there are two or more headers having the highest priority the input arbitration circuitry, responsive to two or more priority signals, determines which message packet having the highest priority header was received on the highest priority input.

22. A routing switch having a plurality of inputs for receiving message packets, each message packet including a header indicative of at least one of a plurality of outputs of the routing switch to which the message packet is to be routed, the routing switch comprising:

storage circuitry for storing a plurality of sets of grouping information, each set being associated with one output of the routing switch, wherein for each output the set of grouping information groups other outputs of the routing switch additionally suitable for transmitting any message packet which may be transmitted on that output;

addressing circuitry, responsive to the header of the message packet to be transmitted, for outputting the identity of each output in the group associated with the indicated output; and selection circuitry comprising an arbiter circuit for selecting an output in the group and arranged to receive signals indicating which of the outputs in the group are ready to receive data for outputting.

23. A method of routing a message packet from an input to an output of a routing switch, the message packet including a header indicative of at least one output of the routing switch to which the message packet is to be routed, the method comprising:

storing a plurality of sets of grouping information, each set being associated with one output of the routing switch, wherein for each output the set of grouping information groups other outputs of the routing switch additionally suitable for transmitting any message packet which may be transmitted on that output;

outputting from the stored grouping information the identity of each output in the group associated with the indicated output responsive to the header of the message packet to be transmitted; and selecting an output in said group, wherein each said output in the group has a predetermined selection priority and the step of selecting an output takes into account said predetermined selection priority.

* * * * *